(12) United States Patent  
Koyama et al.

(10) Patent No.: US 9,343,288 B2  
(45) Date of Patent: May 17, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Jun Koyama, Kanagawa (JP); Kei Takahashi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/445,297

(22) Filed: Jul. 29, 2014

(65) Prior Publication Data

US 2015/0035573 A1    Feb. 5, 2015

(30) Foreign Application Priority Data

Jul. 31, 2013  (JP) ................................. 2013-158403

(51) Int. Cl.
| | |
|---|---|
| *G05F 3/24* | (2006.01) |
| *H01L 21/00* | (2006.01) |
| *H01L 27/00* | (2006.01) |

(Continued)

(52) U.S. Cl.
CPC ............... *H01L 21/00* (2013.01); *H01L 27/00* (2013.01); *H01L 27/0688* (2013.01); *H01L 27/1225* (2013.01); *H01L 29/7869* (2013.01); *H02M 3/156* (2013.01); *H01L 27/088* (2013.01); *H02M 2001/0025* (2013.01); *H02M 2001/327* (2013.01)

(58) Field of Classification Search
CPC ........................................................ G05F 3/24
USPC ............................................................. 323/265
See application file for complete search history.

(56) References Cited

U.S. PATENT DOCUMENTS

| 4,902,637 A | 2/1990 | Kondou et al. |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Daniel Puentes  
(74) *Attorney, Agent, or Firm* — Fish & Richardson P.C.

(57) ABSTRACT

To increase the degree of integration of a semiconductor device such as a DCDC converter. In a semiconductor device (e.g., DCDC converter) including a controller circuit and a switching transistor, the switching transistor formed using an oxide semiconductor layer is stacked over a substrate on which the controller circuit is formed. The switching transistor includes a backgate to release heat generated in the oxide semiconductor layer. The backgate has electrical conduction with a wiring to release heat and prevent a temperature increase with integration. Moreover, for power saving, a potential hold portion including a transistor and a capacitor may be formed using part of the oxide semiconductor layer over the controller circuit. The potential hold portion is formed in a circuit for generating a bias potential in the controller circuit.

17 Claims, 18 Drawing Sheets

(51) Int. Cl.
  *H02M 3/156* (2006.01)
  *H01L 27/06* (2006.01)
  *H01L 29/786* (2006.01)
  *H01L 27/12* (2006.01)
  *H02M 1/00* (2006.01)
  *H02M 1/32* (2007.01)
  *H01L 27/088* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 8,710,762 | B2 | 4/2014 | Takahashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0248623 | A1* | 10/2008 | Tsai et al. .................. 438/276 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0114918 | A1* | 5/2009 | Wang ................. H01L 27/1225 257/59 |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089417 | A1 | 4/2011 | Yamazaki et al. |
| 2011/0101332 | A1 | 5/2011 | Yamazaki et al. |
| 2011/0101351 | A1 | 5/2011 | Yamazaki |
| 2012/0019222 | A1* | 1/2012 | Kimura et al. ................ 323/282 |
| 2012/0068183 | A1 | 3/2012 | Takemura |
| 2012/0086422 | A1 | 4/2012 | Ito et al. |
| 2013/0271220 | A1 | 10/2013 | Takahashi et al. |
| 2015/0028837 | A1 | 1/2015 | Takahashi |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-019682 A | 1/2012 |
| JP | 2012-089831 A | 5/2012 |
| JP | 2012-100522 A | 5/2012 |
| JP | 2013-235564 A | 11/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas". 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

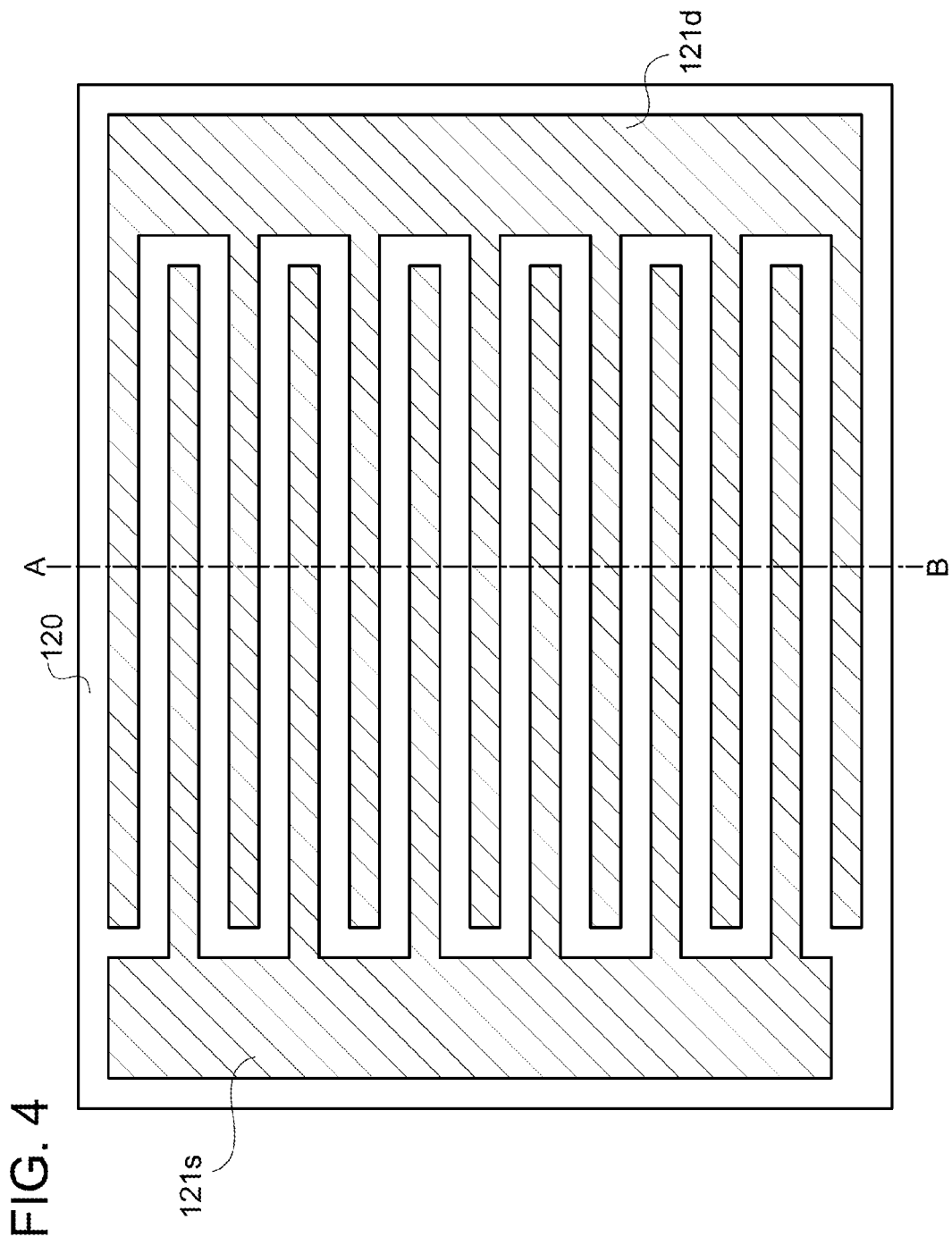

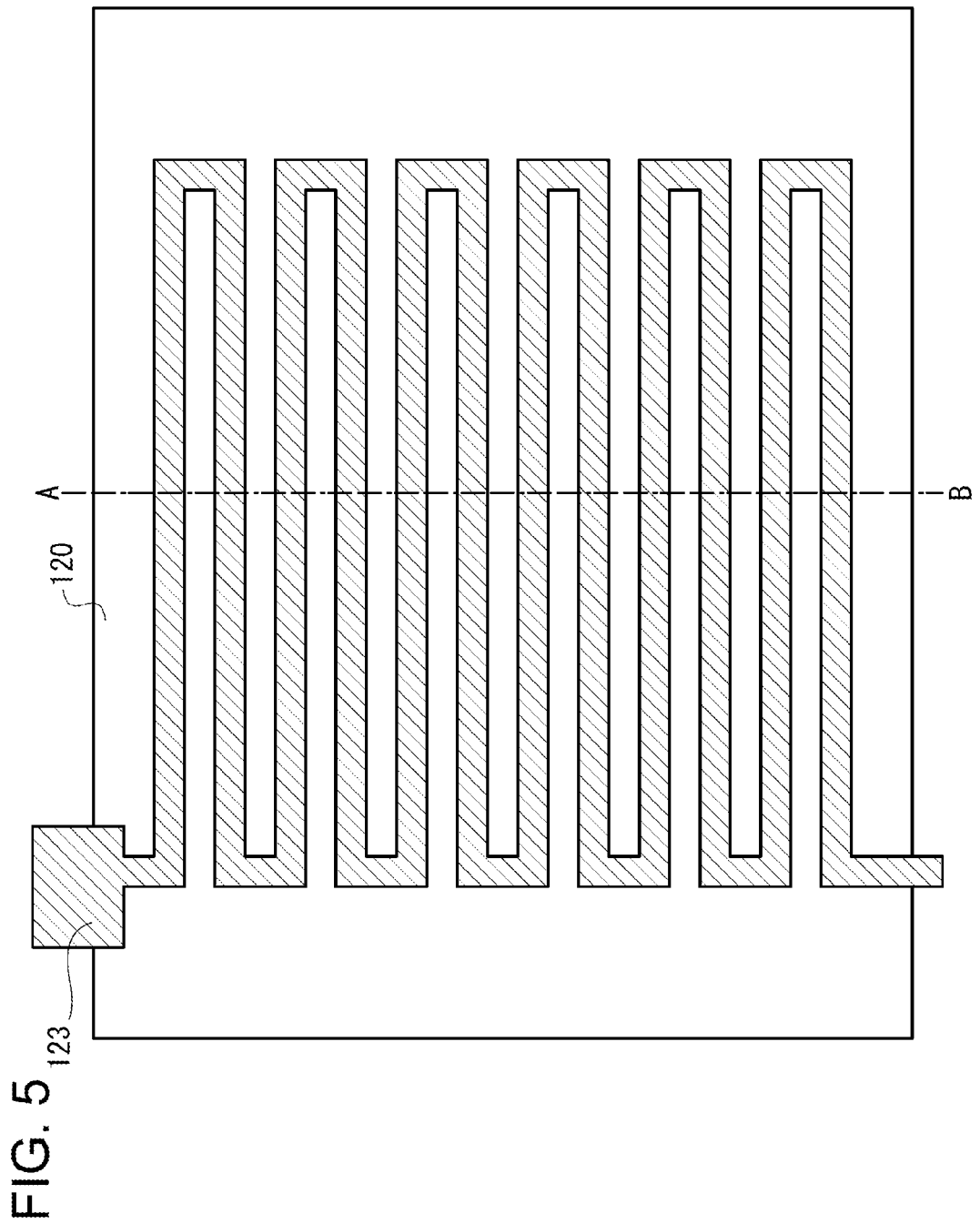

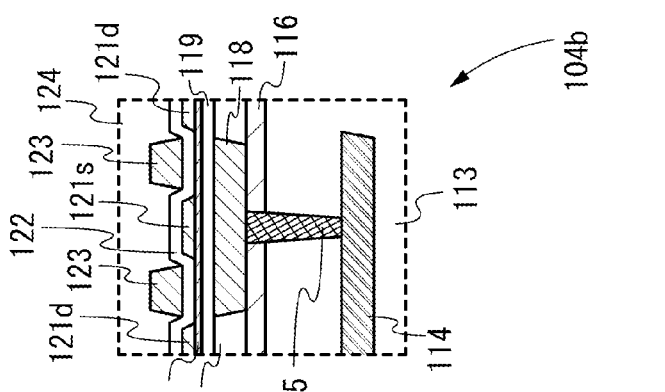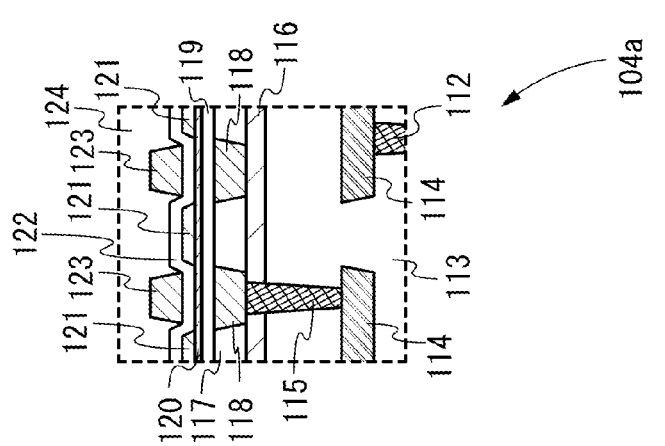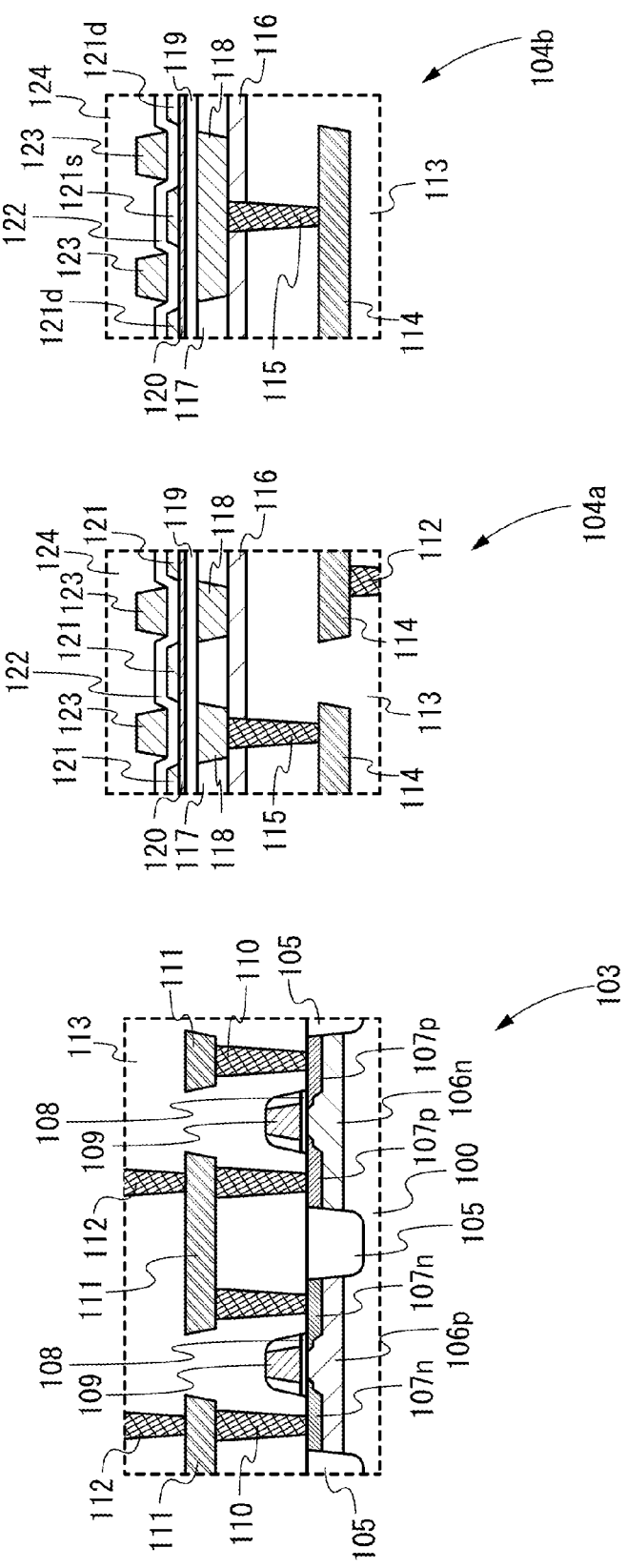

133

131

SEMICONDUCTOR DEVICE

BACKGROUND OF THE INVENTION

1. Field of the Invention

The present invention relates to an electronic device including a semiconductor device.

2. Description of the Related Art

A DCDC converter is a circuit for converting a voltage into another voltage that is higher than or lower than the voltage. A DCDC converter including both a transistor containing silicon (Si) in a semiconductor layer to be a channel formation region and a transistor containing an oxide semiconductor (OS) in a semiconductor layer to be a channel formation region (the latter transistor is hereinafter referred to as "OS transistor") is proposed (see Patent Documents 1 and 2).

REFERENCE

Patent Document

[Patent Document 1] Japanese Published Patent Application No. 2012-19682
[Patent Document 2] Japanese Published Patent Application No. 2012-100522
[Patent Document 3] Japanese Published Patent Application No. 2012-089831

SUMMARY OF THE INVENTION

In general, a DCDC converter includes, as illustrated in FIG. 2A, a switching transistor 202, a controller circuit 201 that controls the switching transistor 202, an inductor 203, a diode 204, a capacitor 205, a resistor 206, and a resistor 207. A terminal Vin is held at one potential. A potential different from the potential of the terminal Vin is output from a terminal Vout.

When low electric power is generated, the switching transistor 202 and the controller circuit 201 are both formed over a semiconductor chip 200, as in FIG. 2A. As seen from FIG. 2B, the area occupied by the switching transistor 202 is relatively large and can be 10% to 50% of the semiconductor chip 200, which hinders circuit integration.

An object of one embodiment of the present invention is to provide a high-integrated semiconductor device and/or a semiconductor device or the like with a novel structure.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

In a semiconductor device (e.g., DCDC converter) including a switching transistor and a controller circuit for controlling the switching transistor, the switching transistor is stacked over the controller circuit (a layer of the controller circuit).

The switching transistor may have a backgate that is connected to a substrate by one or more conductive materials.

Note that a transistor that can withstand high voltages is used as the switching transistor. For example, a transistor in which a channel contains a wide bandgap semiconductor material such as an oxide semiconductor, that is, an oxide semiconductor transistor can be used (see Patent Document 3).

The controller circuit may include a timer, an error amplifier, and a reference voltage generation circuit. The DCDC converter may include any of a resistor, a capacitor, an inductor, and a diode. The DCDC converter may further include a diode, a resistor, and a capacitor that are stacked over the controller circuit.

The controller circuit may include a bias circuit, and a potential hold portion for holding a constant potential generated in the bias circuit. The potential hold portion includes a capacitor and a transistor capable of being intermittently turned on or off using the timer. The transistor may be an oxide semiconductor transistor.

One embodiment of the present invention can provide a highly integrated semiconductor device (e.g., DCDC converter). A reduction in area per chip can increase the number of chips per wafer and reduce cost for per chip.

Although high integration causes a problem of heat generation, this can be solved by forming a backgate in a switching transistor. Thus, heat generated by an oxide semiconductor layer can be absorbed and released to a substrate.

Note that as in Patent Documents 1 and 2, an oxide semiconductor transistor can have extremely low off-state current per channel width. In general, a silicon transistor is used as a switching transistor, and the channel width of a switching transistor is extremely large and consequently the off-state current is likely to be large. An off-state current per channel width of a transistor whose channel is formed in an oxide semiconductor film is small. Consequently, if the channel width is increased, the off-state current can be reduced and power consumption can be suppressed.

Current is applied to a bias circuit to generate a pre-determined potential and consequently power consumption is increased if the circuit is activated all the time. However, using an oxide semiconductor transistor for the bias circuit can reduce the power consumption. This is because the off-state current is small as described above, and a potential hold portion composed of the oxide semiconductor transistor and a capacitor can hold the potential for a long time and thus applying current can be stopped.

BRIEF DESCRIPTION OF THE DRAWINGS

FIG. 4 illustrates a structure example of a semiconductor device.
FIG. 5 illustrates a structure example of a semiconductor device.
FIGS. 9A to 9C are examples of schematic cross-sectional views of a semiconductor device.

DETAILED DESCRIPTION OF THE INVENTION

Figure 1:
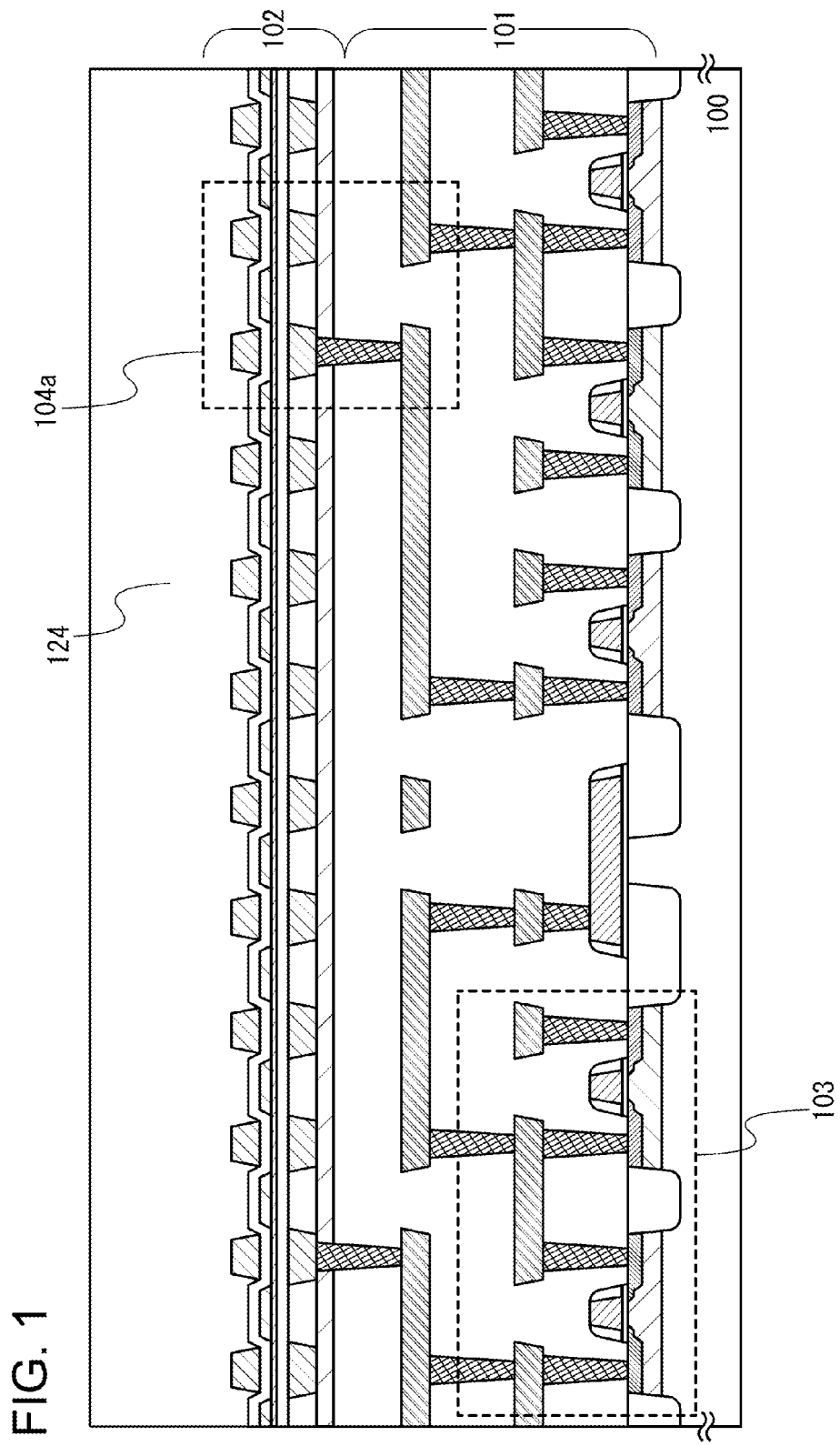
FIG. 1 is an example of a schematic cross-sectional view of a semiconductor device.
Figure 2A:
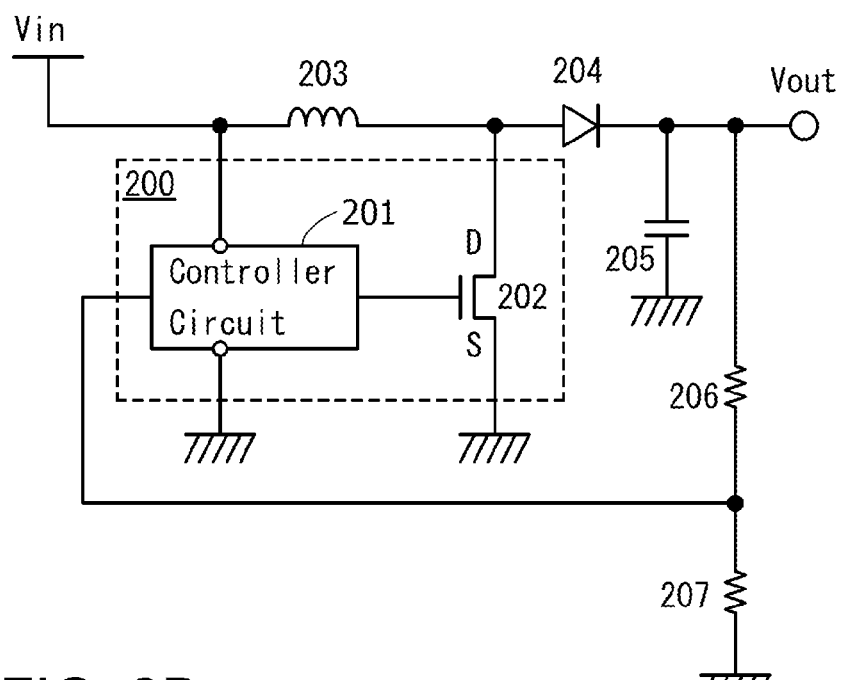
FIGS. 2A and 2B are a circuit diagram and a structure of a conventional DCDC converter.
Figure 2B:
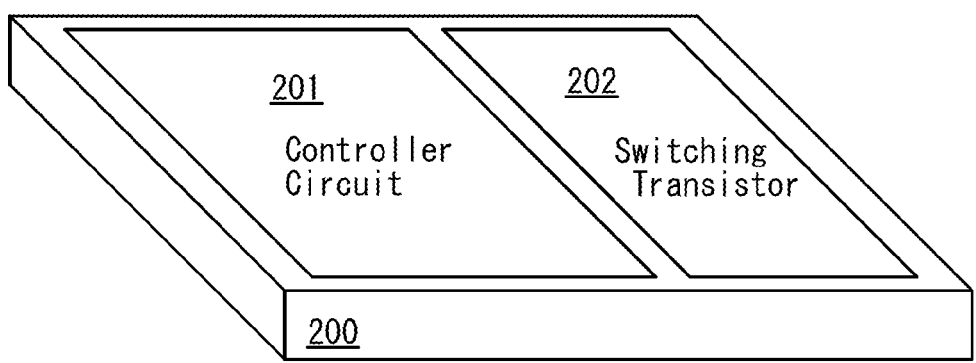

Hereinafter, embodiments will be described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description of Embodiment below. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode. In some cases, the source and the drain can be defined from the relationship of potentials.

In this specification and the like, ordinal numbers such as "first," "second," and "third" are used to avoid confusion among components, and thus do not limit the number of the components.

In this specification and the like, terms for describing arrangement, such as "over" and "under," are used for convenience for describing the positional relationship between components with reference to drawings. The positional relation between components is changed as appropriate in accordance with a direction in which each component is described. Thus, there is no limitation on terms used in this specification, and description can be made appropriately depending on the situation.

In this specification and the like, the positional relationships of circuit blocks in diagrams are specified for description, and even in the case where different circuit blocks have different functions in the diagrams, the different circuit blocks might be provided in an actual circuit or region so that different functions are achieved in the same circuit or region. The function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

FIG. 1 is a schematic cross-sectional view of a DCDC converter. The DCDC converter includes a controller circuit 101 over a semiconductor substrate 100 such as single crystal silicon and a switching transistor 102 over the controller circuit 101. The switching transistor 102 includes one transistor or a plurality of transistors. The switching transistor 102 is covered with an upper insulator 124. The upper insulator 124 may be a stacked-layer. The substrate 100 may be an SOI substrate.

FIG. 9A illustrates the details of a region 103 in FIG. 1. The region 103 has an N-channel silicon transistor and a P-channel silicon transistor. The N-channel transistor is composed of a P-type well 106p and an N-type impurity region 107n. The P-channel transistor is composed of an N-type well 106n and a P-type impurity region 107p. The P-type well 106p and the N-type well 106n are separated from each other by an element separation insulator 105.

This example is a so-called twin-well structure, but is not limited thereto. The silicon transistor may be formed of thin-film single crystal silicon. Each impurity concentration of the P-type well 106p, the N-type well 106n, the P-type impurity region 107p, and the N-type impurity region 107n is not necessarily uniform. Furthermore, a silicide layer may be provided in contact with the P-type impurity region 107p and the N-type impurity region 107n.

A gate insulator 108 is each provided over the P-type well 106p and the N-type impurity region 107n, and over the N-type well 106n and the P-type impurity region 107p. The gate insulator 108 may be formed of a plurality of layers. The composition of the gate insulator 108 may be different over the P-type well 106p, the N-type impurity region 107n, the N-type well 106n, and the P-type impurity region 107p. Silicon oxide, hafnium oxide, lanthanum oxide, or the like can be used as the gate insulator 108.

For example, silicon oxide is used as the gate insulator 108 over the N-type well 106n, and a stacked material of silicon oxide and hafnium oxide is used as the gate insulator 108 over the P-type well 106p.

A gate wiring 109 is provided over the gate insulator 108. The gate wiring 109 may be formed of a plurality of layers and may have different compositions, shapes, and layer structures depending on the positions where the gate wiring 109 is to be formed. Silicon whose conductivity is increased by impurity addition, metal such as tantalum, titanium, tungsten, and molybdenum, nitride, carbide, or silicide of the metal, or the like can be used for the gate wiring 109.

A first contact plug 110 is in contact with each of the P-type impurity region 107p and the N-type impurity region 107n. A first layer wiring 111 is in contact with the first contact plug 110. In addition, a second contact plug 112 is in contact with the first layer wiring 111. The contact plugs and the wirings are formed using multilevel interconnection technique. A lower interlayer insulator 113 is provided between them.

Note that the lower interlayer insulator 113 is formed of a plurality of insulating layers (not illustrated). An insulator such as silicon oxide, silicon nitride, silicon oxide carbide, or silicon oxynitride can be used for the lower interlayer insulator 113.

Materials with high conductivity such as metal such as tantalum, titanium, tungsten, molybdenum, copper, and aluminum, nitride, carbide, or silicide of these metals, or the like can be used for the contact plug and the gate wiring.

In view of, particularly, electrical conductivity and heat conductivity that is described later, the ratio of copper in the contact plugs and wirings is preferably high. In order to prevent contamination by copper, materials other than copper that have barrier properties need to be used appropriately. Thus, the ratio of copper in the contact plugs and wirings is preferably 80% to 90%, inclusive.

FIG. 9B illustrates the details of a region 104*a* in FIG. 1. In the region 104*a*, part of the oxide semiconductor transistor is illustrated. The details of the oxide semiconductor transistors (OS transistors) are described later.

A barrier layer 116 is provided over the second contact plug 112 and a second layer wiring 114 which are formed using multilevel interconnection technique. The barrier layer 116 is formed using silicon nitride, aluminum oxide, aluminum nitride, aluminum oxynitride, or the like, and has a function of preventing movement of hydrogen and oxygen.

A third contact plug 115 which passes through the barrier layer 116 and reaches the second layer wiring 114 is provided. A third layer wiring 118 is in contact with the third contact plug 115 and is embedded in an interlayer insulating layer 117. The interlayer insulating layer 117 can be formed using the materials of the lower interlayer insulator 113.

Note that the third layer wiring 118 functions as a backgate of the OS transistor and is kept at the same potential as a low potential (e.g., GND) of the controller circuit 101. When the OS transistor is N-channel type, the potential of the backgate is set to GND, whereby the off-state current can be reduced. When the OS transistor is P-channel type, the potential of the backgate is set to a high potential (e.g., VDD) of the controller circuit 101, producing the same effect. Note that the backgate is not necessarily provided in the OS transistor.

A backgate insulator 119 is provided over the third layer wiring 118. An oxide semiconductor layer 120 is provided over the backgate insulator 119. Furthermore, a fourth layer wiring 121 is provided over the oxide semiconductor layer 120. The fourth layer wiring 121 functions as a source or a drain of the OS transistor. Among the three portions denoted by 121 illustrated in FIG. 9B, when the central one is a source, the other two are drains; when the central one is a drain, the other two are sources.

A frontgate insulator 122 covers the fourth layer wiring 121. A fifth layer wiring 123 is provided over the frontgate insulator 122. The fifth layer wiring 123 functions as a frontgate. An upper insulator 124 covers the fifth layer wiring 123. The materials of the lower interlayer insulator 113 can be used for the upper insulator 124.

Another example is that a material containing a lot of electron trap states (e.g., hafnium oxide, aluminum oxide, or tantalum oxide) is used in part of the frontgate insulator 122, as the stacked-layer of silicon oxide and hafnium oxide, and the potential of the fifth layer wiring 123 is kept higher than the potential of the fourth layer wiring 121 for more than a second, typically more than a minute, at high temperatures (higher than the operating temperature or the storage temperature of the semiconductor device; 125° C. to 450° C. inclusive, typically 150° C. to 300° C. inclusive).

As a result, electrons transfer from the oxide semiconductor layer 120 toward the fifth layer wiring 123, and some of the electrons are trapped in electron trap states. In the OS transistor in which a necessary amount of electrons is trapped by the electron trap states in this manner, the threshold voltage is shifted in the positive direction. By controlling the potential of the fifth layer wiring 123, the amount of electrons to be trapped can be controlled, and thus the threshold voltage can be controlled. Furthermore, the treatment for trapping the electrons may be performed in the manufacturing process of the OS transistor.

The treatment for trapping the electrons may be performed at any of the following timings before leaving the factory, for example: after pre-process (wafer process), after wafer dicing, and after packaging. In any case, it is preferable that the transistor be not exposed to a temperature higher than or equal to 125° C. for one hour or more after that.

In this example, the wiring in the controller circuit is a stacked-layer of the first layer wiring 111 and the second layer wiring 114, but may be formed of more than two wiring layers. The switching transistor 102 in this example is formed with a single layer, but may be formed with a plurality of layers.

Figure 3A:
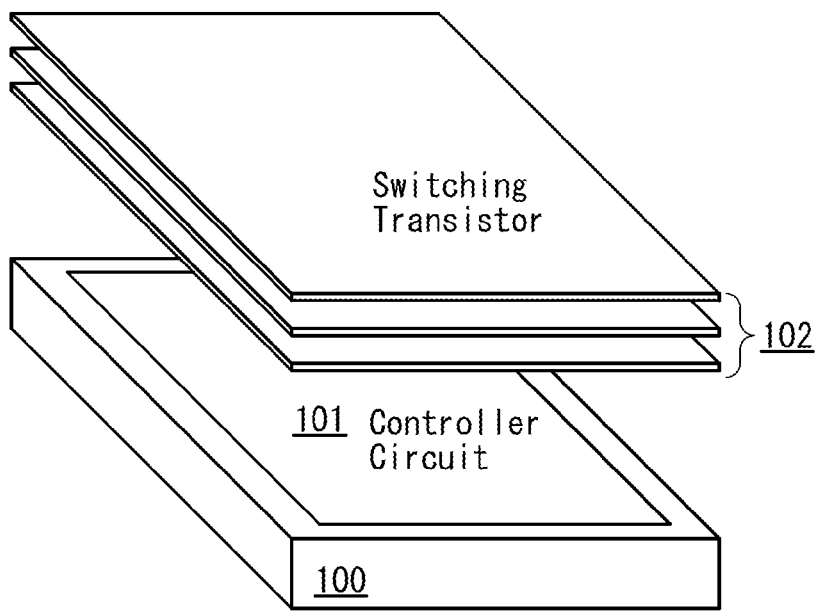
FIGS. 3A and 3B illustrate a structure example of a semiconductor device.

For example, the switching transistor 102 may be formed with three layers as in FIG. 3A. The chip area can be reduced than the conventional one by stacking the switching transistor 102 over the controller circuit 101. Moreover, by increasing the effective area of the switching transistor 102, the channel width of the switching transistor 102 can be increased, the on-state resistance thereof can be reduced, and the conversion efficiency can be increased.

FIG. 4 illustrates a layout example of the fourth layer wiring 121. The fourth layer wiring 121 over the oxide semiconductor layer 120 has a shape in which two comb-like separated parts, a drain electrode 121*d* and a source electrode 121*s*, mesh with each other.

FIG. 5 is a layout example of the fifth layer wiring 123. The dashed-dotted line A-B in FIG. 5 corresponds to dashed-dotted line A-B in FIG. 4. FIG. 1 is a cross section along the dashed-dotted line A-B. The fifth layer wiring 123 is provided along the gap between the drain electrode 121*d* and the source electrode 121*s*. Note that the third layer wiring 118 has a shape similar to the fifth layer wiring 123.

Figure 6:
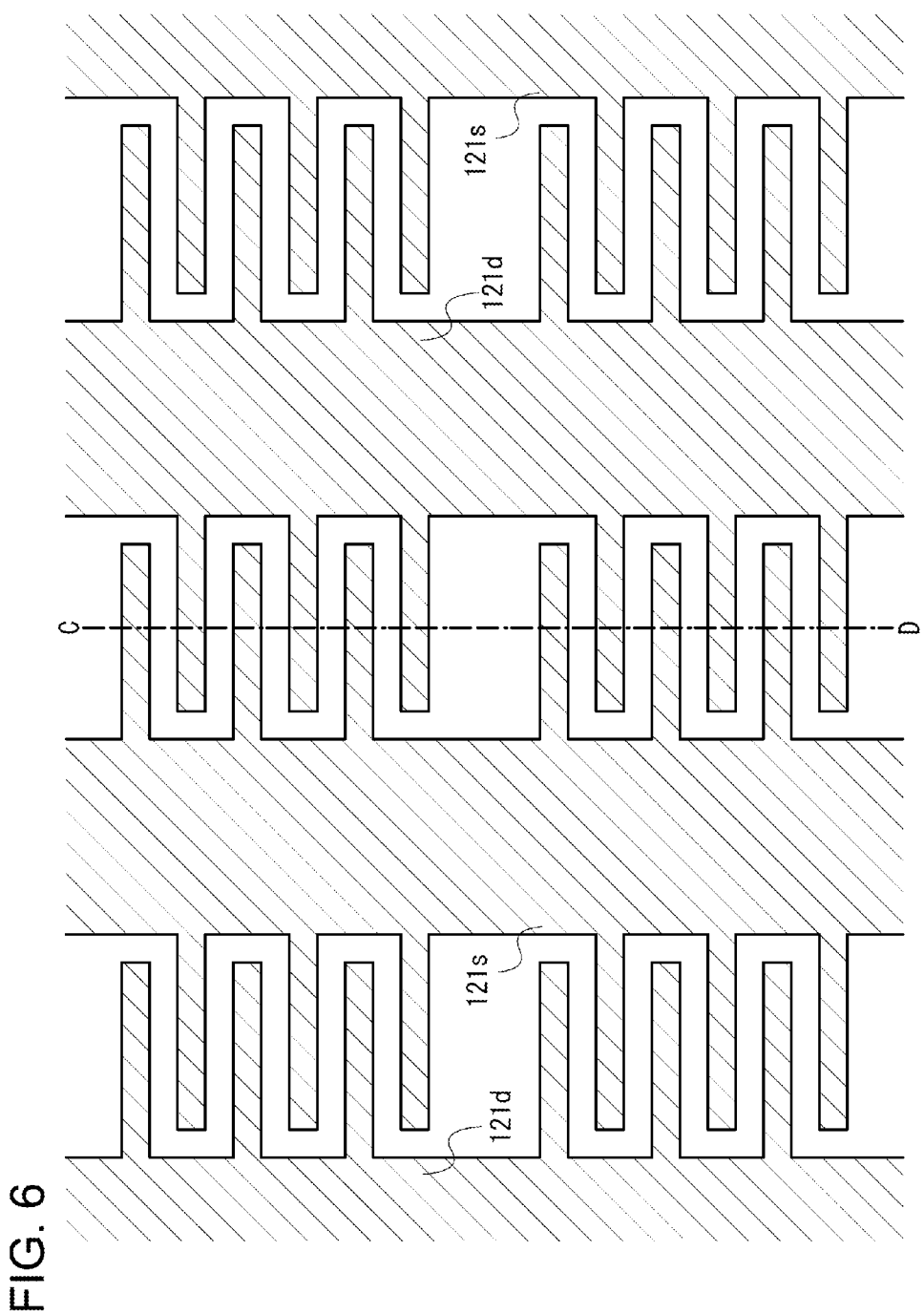
FIG. 6 illustrates a structure example of a semiconductor device.

FIG. 6 is another layout example of the fourth layer wiring 121. Although the fourth layer wiring 121 seems to be divided into some parts, the parts are connected out of the figure and are divided into only two parts of the drain electrode 121*d* and the source electrode 121*s*. The comb-like drain electrode 121*d* and source electrode 121*s* mesh with each other.

The drain electrode 121*d* and the source electrode 121*s* each have a wide width portion to reduce wiring resistance. Similarly, the drain electrode 121*d* and the source electrode 121*s* may have a thick portion to reduce resistance. For example, the thickest portion can be 10 times to 100 times, inclusive, the thinnest portion.

Figure 7:
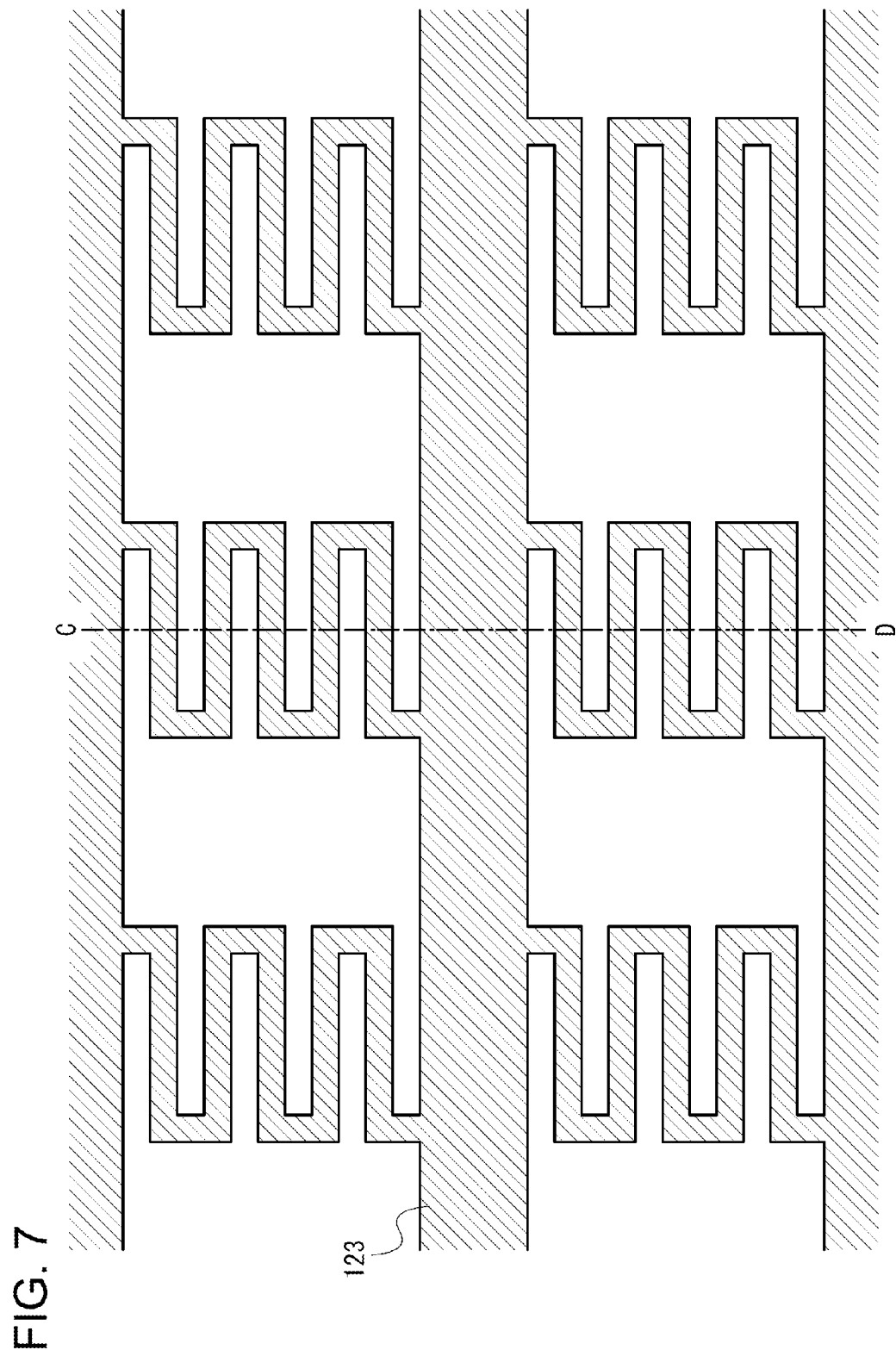
FIG. 7 illustrates a structure example of a semiconductor device.

FIG. 7 is another layout example of the fifth layer wiring 123. The dashed-dotted line C-D in FIG. 7 corresponds to dashed-dotted line C-D in FIG. 6. The fifth layer wiring 123 is provided along the gap between the drain electrode 121*d* and the source electrode 121*s*. Note that the third layer wiring 118 has a shape similar to the fifth layer wiring 123.

The fifth layer wiring 123 has a wide width portion to reduce wiring resistance. Similarly, the fifth layer wiring 123 may have a thick portion to reduce resistance. For example, the thickest portion can be 10 times to 100 times, inclusive, the thinnest portion.

Figure 8:
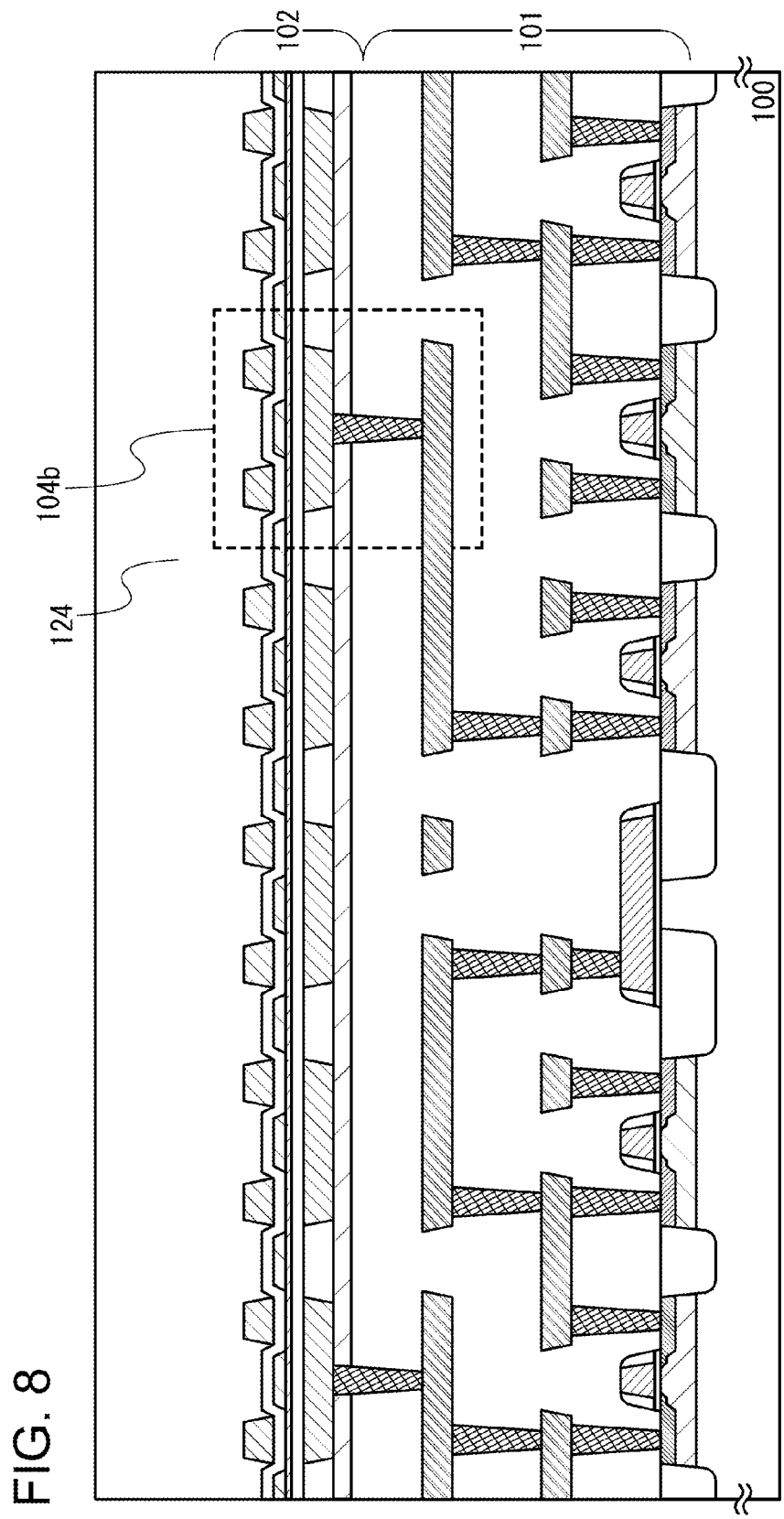
FIG. 8 is an example of a schematic cross-sectional view of a semiconductor device.

FIG. 8 is another schematic cross-sectional view of a semiconductor device. A large difference between FIG. 1 and FIG. 8 is the shape of the third layer wiring 118. The details are described with reference to FIG. 9C. As illustrated in FIG. 9C, a region 104b in FIG. 8 includes the second layer wiring 114 in the lower interlayer insulator 113, the third contact plug 115, the barrier layer 116, the interlayer insulating layer 117, the third layer wiring 118, the backgate insulator 119, the oxide semiconductor layer 120, the fourth layer wiring (the drain electrode 121d and the source electrode 121s), the front-gate insulator 122, the fifth layer wiring 123, and the upper insulator 124.

Unlike the OS transistor in FIG. 1 (and FIG. 9B), the third layer wiring 118 overlaps part of or entire of the source electrode 121s. Note that the third layer wiring 118 does not preferably overlap the drain electrode 121d. A large overlap between the oxide semiconductor layer 120 and the third layer wiring 118 as in this example achieves release of heat that is generated by the oxide semiconductor layer 120, through the third layer wiring 118.

In particular, the third layer wiring 118 is in contact with the substrate 100 through metal (the first contact plug 110, the first layer wiring 111, the second contact plug 112, the second layer wiring 114, and the third contact plug 115) and can rapidly release the heat to the substrate 100.

The thickness of the third layer wiring 118 may be increased (e.g., 500 nm or more) to improve the heat dissipation property. It is also preferable to use copper, which has high heat conductivity, for some or all of the heat dissipation paths of the first contact plug 110, the first layer wiring 111, the second contact plug 112, the second layer wiring 114, the third contact plug 115, the third layer wiring 118, and the like.

As described above, using an OS transistor as the switching transistor 102 and forming a backgate in the OS transistor, and using the backgate as a heat dissipation plate in addition to a normal backgate produce the effect of releasing heat generated by the switching transistor 102 and suppressing temperature increase of the semiconductor device. In this manner, a DCDC converter in which temperature increase of chips is suppressed can be provided while suppressing cost increase of the chips.

Figure 10A:
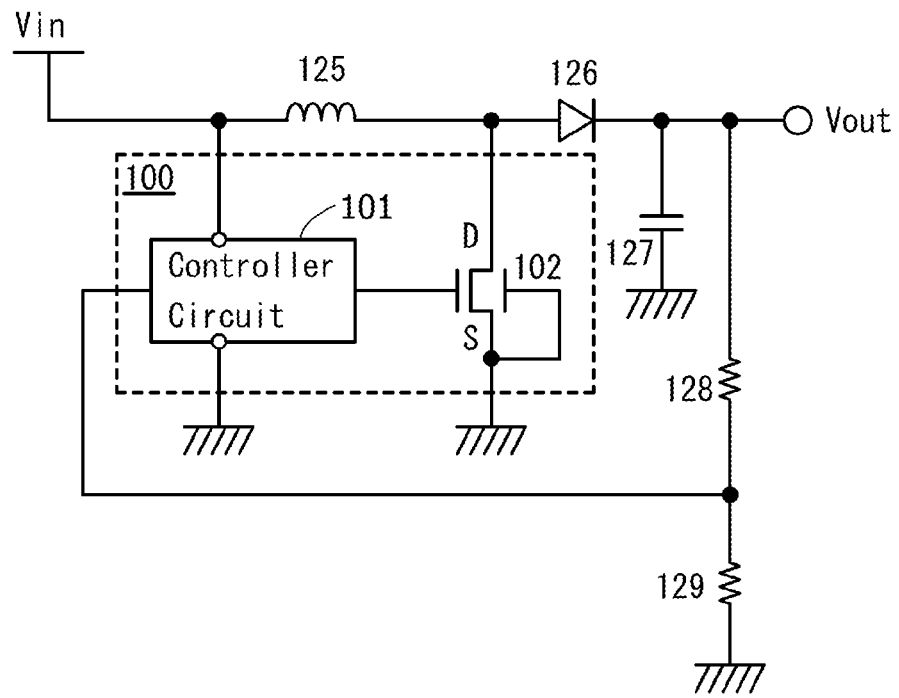
FIGS. 10A and 10B are examples of circuit diagrams of a semiconductor device.

FIG. 10A is an example of a non-isolated step-up choke type DCDC converter. The DCDC converter includes, as described above, the controller circuit 101 over the substrate 100 and the switching transistor 102 stacked over the controller circuit. The switching transistor 102 is an OS transistor. At least one transistor of the controller circuit 101 is a transistor other than an OS transistor.

In addition, the DCDC converter includes an inductor 125, a diode 126, a capacitor 127, a resistor 128, and a resistor 129 separately from the substrate 100. In FIG. 10A, the low potential of the controller circuit 101, the source of the switching transistor 102, the capacitor 127, and the resistor 129 are grounded, but do not necessarily have the same potential.

Figure 11A:
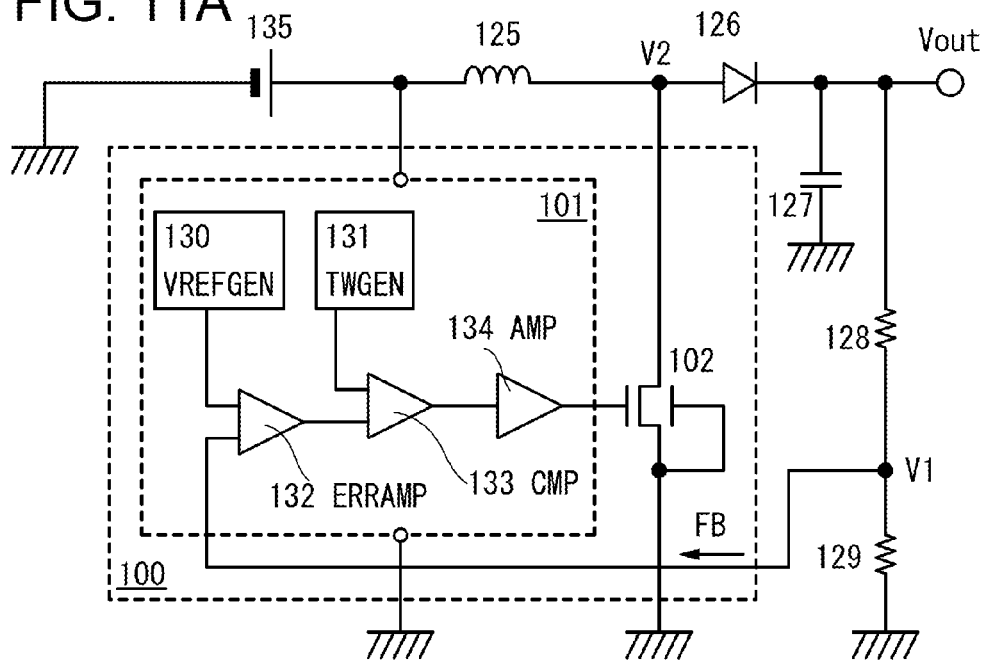
FIGS. 11A and 11B are examples of circuit diagrams of a semiconductor device.

The controller circuit 101 in FIG. 11A includes a reference voltage generation circuit 130, a triangle wave generation circuit 131, an error amplifier 132, a comparator 133, and an amplifier circuit 134. All of them may include only silicon transistors, or some of them may include an OS transistor. It is preferable that the high potential and the low potential of the power supply potential of the controller circuit 101 are the same as the positive potential and the negative potential (GND) of a battery 135, respectively.

Note that the output potential of the reference voltage generation circuit 130 and values of the resistors 128 and 129 can be determined depending on an output potential Vout. The potential output from the triangle wave generation circuit 131 is a triangle wave which changes around the potential output from the reference voltage generation circuit 130.

A potential V1 and a potential of the reference voltage generation circuit 130 are input to the error amplifier 132. The potential V1 is obtained by dividing a difference between the output potential Vout and GND by the resistors 128 and 129. For example, when the potential V1 is lower than the potential of the reference voltage generation circuit 130, their difference is amplified and a potential lower than the potential of the reference voltage generation circuit 130 is output from the error amplifier 132. Each output of the error amplifier 132 and the triangle wave generation circuit 131 are input to the comparator 133.

The comparator 133 is configured to compare two input potentials, and output a high potential when one input potential is higher than the other and a low potential when the one is lower than the other. Consequently, the potential output from the comparator 133 is a rectangular wave with unfixed duty ratio (i.e., pulse width modulation signal, PWM signal). When the output potential of the error amplifier 132 is lower than the output potential of the triangle wave generation circuit 131, the output potential of the comparator 133 is high; when the output potential of the error amplifier 132 is higher, the output potential of the comparator 133 is low.

Here, when the output potential of the error amplifier 132 is lower than that of the reference voltage generation circuit 130, time during which the output potential of the error amplifier 132 is lower than the output potential of the triangle wave generation circuit 131 is longer than time during which the output potential of the error amplifier 132 is higher than the output potential of the triangle wave generation circuit 131. In other words, the rectangular pulse output from the comparator 133 is at a high level for longer time than it is at a low level.

This rectangular pulse is amplified by the amplifier circuit 134 and is input to the gate of the switching transistor 102. When time at high level is longer, time during which the switching transistor 102 is ON is longer. The switching transistor 102 is ON and current flows from the battery 135 to the switching transistor 102 through the inductor 125. Consequently, a potential V2 which is the potential of the drain of the switching transistor 102 gets closer to GND. In addition, energy of the current is stored as magnetic energy in the inductor 125.

The switching transistor 102 is turned off to stop the current between the source and drain of the switching transistor 102. Current keeps flowing from the inductor 125 to the drain of the switching transistor 102 due to inertia and counter electromotive force is generated. Consequently, the potential V2 becomes higher than the positive potential of the battery 135. Thus, current flows through the diode 126 to charge the capacitor 127.

In this manner, the potential V2 significantly changes by turning on or off the switching transistor 102. When the capacitance of the capacitor 127 is large enough, change of the output current Vout is extremely small, and thus Vout can be regarded nearly as a direct current. Thus, potentials higher than the positive potential of the battery 135 can be extracted as the output potential Vout.

The output potential Vout is higher when time during which the switching transistor is ON is longer than time during which it is OFF than when time during which the switching transistor is ON is not longer than time during which it is OFF.

The output potential Vout can be adjusted by feedback of the potential V1, which is obtained by dividing the output potential Vout by the resistors 128 and 129, to the error amplifier 132 as a feedback signal (denoted by FB in drawings)

In other words, when the output potential Vout is increased, the potential V1 is increased and thus time during which the switching transistor 102 is ON is shorter, and operation for lowering the output potential Vout is performed. On the other hand, when the output potential Vout is lowered, feedback is performed so that time during which the switching transistor 102 is ON is longer and operation for increasing the output potential Vout is performed. Thus, the output potential Vout of the DCDC converter is stabilized. Embodiment 2 may be referred to for the details.

Note that in order to reduce current that flows through the resistor 128 and 129, the resistance of the resistors 128 and 129 needs to be increased; however, delay of the feedback signal becomes large and error due to thermal noise is caused as a result of the increase of the resistance. In some cases, the output potential Vout may be directly input to the error amplifier 132 instead of providing the resistors 128 and 129.

Figure 3B:
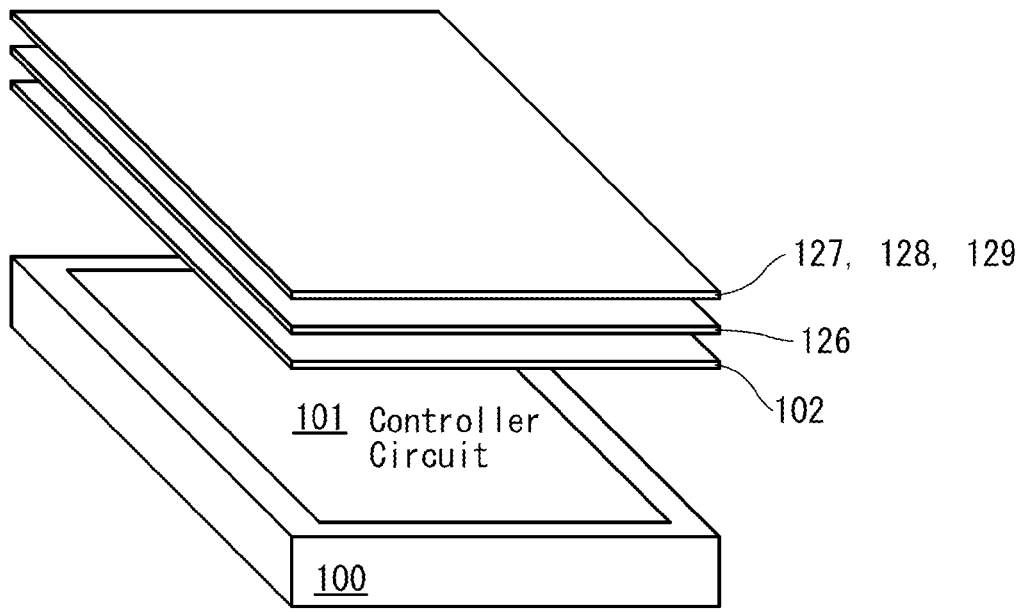
Figure 10B:
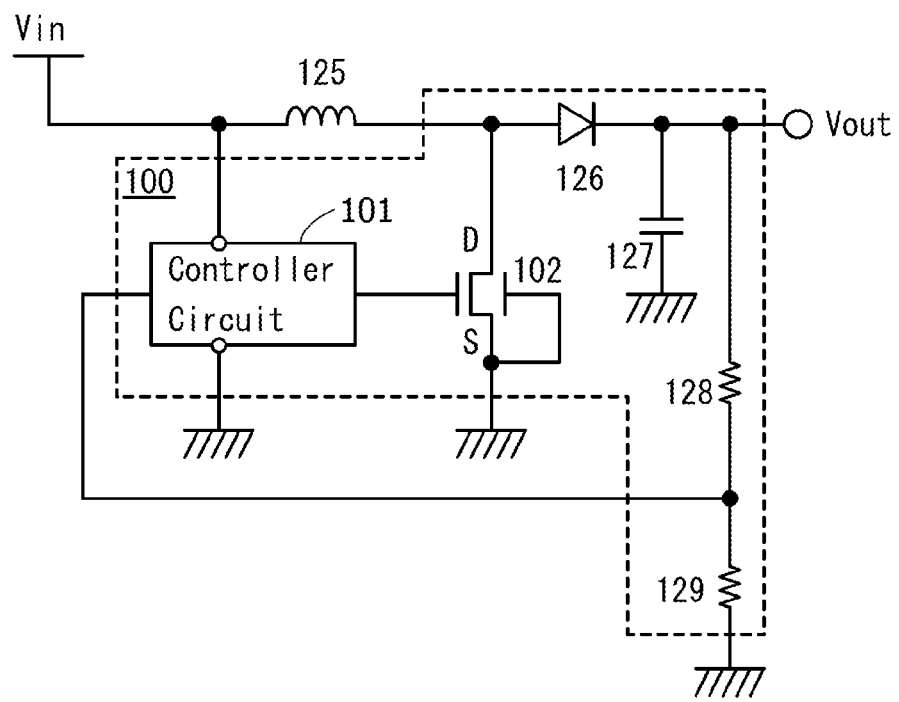

FIG. 10B illustrates another DCDC converter. The DCDC converter in FIG. 10B has a structure in which not only the controller circuit 101 and the switching transistor 102, but also the diode 126, the capacitor 127, and the resistors 128 and 129 are stacked over the substrate 100 as illustrated in FIG. 3B.

Figure 11B:
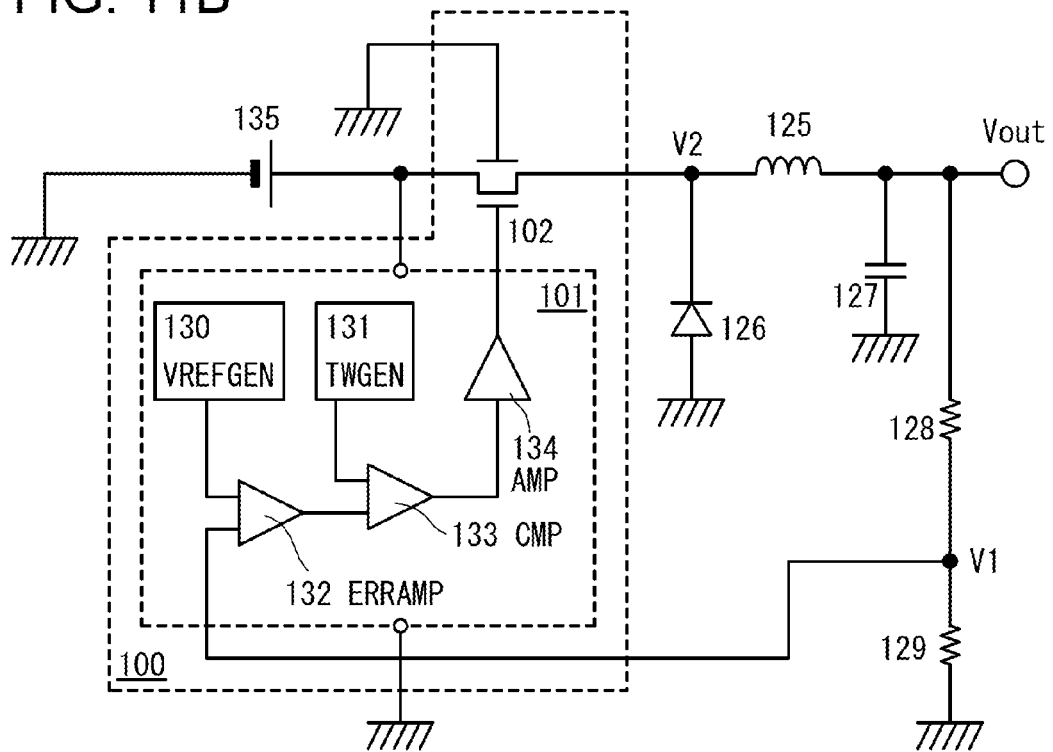

Note that the DCDC converter is not limited to the above and may have a circuit structure illustrated in FIG. 11B. The DCDC converter in FIG. 11B is a non-isolated step-down choke type. A circuit element is the same as that in FIG. 11A except the position of the switching transistor 102, the inductor 125, and the diode 126.

Note that FIG. 11B is similar to FIG. 11A in that the switching transistor 102 is stacked over the substrate 100 over which the controller circuit 101 is formed.

The above examples are DCDC converters using only the inductor 125 as a voltage conversion element, and a transformer can be used to form a similar circuit. For example, an isolated forward converter, an isolated fly-back converter, a half-bridge converter, a full-bridge converter, and the like are used.

In these examples, a switching transistor is turned on or off by a controller circuit to generate an alternating current in a primary side coil and extract needed voltage by the induced electromotive force generated in a secondary side coil. Similarly to the above examples, it is preferable that a controller circuit be formed over a substrate and an OS transistor be stacked thereover as a switching transistor.

Embodiment 2

In Embodiment 2, details of a controller circuit of a DCDC converter are described. As described in Embodiment 1, the controller circuit outputs a pulse width modulation signal (PWM Signal) to control conduction of a switching transistor. The controller circuit is supplied with an input potential Vin and a feedback signal from an output potential Vout to output a pulse width modulation signal.

Figure 12:
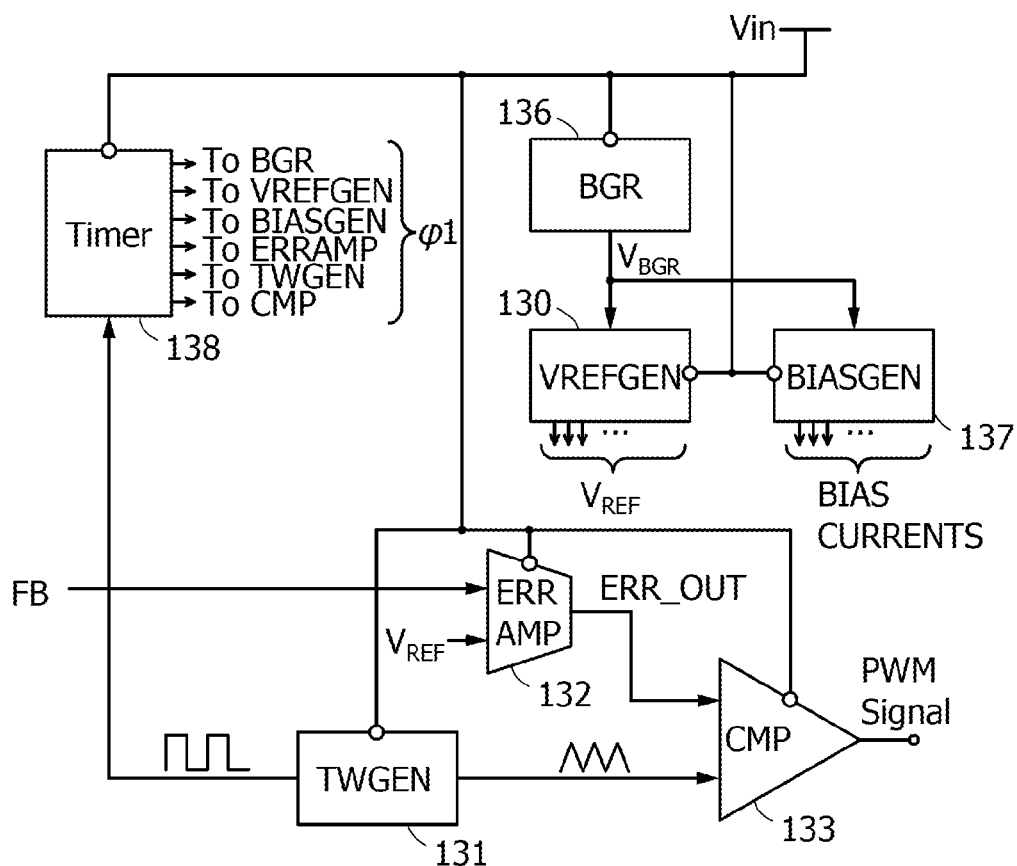
FIG. 12 is an example of a block diagram of a controller circuit.

FIG. 12 is a block diagram of a controller circuit 101 in this embodiment. The controller circuit 101 in FIG. 12 includes a band gap reference circuit 136, the reference voltage generation circuit 130, a reference bias generation circuit 137, the triangle wave generation circuit 131, the error amplifier 132, the comparator 133, and a timer 138.

The band gap reference circuit 136 has a function of generating a reference potential $V_{BGR}$ in accordance with the input potential Vin. The reference voltage $V_{BGR}$ is used for operating the reference voltage generation circuit 130 and the reference bias generation circuit 137. Note that in the band gap reference circuit 136, the supply of the input potential Vin can be stopped and generation of the reference potential $V_{BGR}$ can be stopped in accordance with a mode switching signal (abbreviated to "φ1" in drawings) that is output from the timer 138. Note that a switch for power gating may be provided between a wiring for applying the input potential Vin and the band gap reference circuit 136 and is turned on or off to stop the supply of the input potential Vin.

The reference voltage generation circuit 130 has a function of generating a reference voltage $V_{REF}$ in accordance with the reference voltage $V_{BGR}$. The reference voltage $V_{REF}$ is used in the controller circuit 101. The reference potential $V_{REF}$ is supplied to the error amplifier 132, for example. Note that the input voltage Vin is supplied to the reference voltage generation circuit 130, and the supply of the input voltage Vin can be stopped in accordance with a mode switching signal output from the timer 138 to stop generation of the potential $V_{REF}$. Note that in order to stop the supply of the input potential Vin, a switch for power gating is provided between a wiring for applying the input potential Vin and the reference voltage generation circuit 130 and is turned on or off.

The reference bias generation circuit 137 has a function of generating bias currents (abbreviated to "BIAS CURRENTS" in drawings) in accordance with the reference potential $V_{BGR}$. The bias currents are used in the controller circuit 101. The bias currents are supplied to the triangle wave generation circuit 131, the error amplifier 132, and the comparator 133, for example. In the reference bias generation circuit 137, the supply of the input potential Vin can be stopped and generation of the bias currents can be stopped in accordance with a mode switching signal that is output from the timer 138. Note that a switch for power gating may be provided between the wiring for applying the input potential Vin and the reference bias generation circuit 137 and is turned on or off to stop the supply of the input potential Vin.

The triangle wave generation circuit 131 is a circuit to which the bias current and the input potential Vin are supplied. The triangle wave generation circuit 131 has a function of generating a clock signal and a triangle wave that are used in the controller circuit 101. The triangle wave generation circuit 131 includes a bias circuit, a reference clock generation circuit, and a potential hold portion, for example. The bias circuit generates a bias potential having a constant potential in accordance with the bias current. The reference clock generation circuit generates a clock signal and a triangle wave in accordance with the bias potential. The potential hold portion includes a capacitor and a switch. The switch is intermittently turned on or off using the timer 138, so that the bias potential can be held in accordance with the mode switching signal output from the timer 138. Thus, even when the function of the bias circuit is stopped, the bias potential can be continuously supplied to the reference clock generation circuit.

Note that the input potential Vin is supplied to the triangle wave generation circuit 131, and the supply of the input potential Vin to the bias circuit in the triangle wave generation circuit 131 can be stopped in accordance with the mode switching signal output from the timer 138 and generation of the bias potential can be stopped. Note that a switch for power gating may be provided between the bias circuit and the wiring for applying the input potential Vin and is turned on or off to stop the supply of the input potential Vin to the bias circuit.

The error amplifier 132 is a circuit to which the bias current and the input potential Vin are supplied and has a function of generating an error signal (abbreviated to ERR_OUT in drawings) obtained by amplifying a difference between the potential of the feedback signal and the reference potential $V_{REF}$. The error amplifier 132 includes an operational amplifier (OP AMP), an operational trans-conductance amplifier (OT AMP), and a potential hold portion, for example.

The operational amplifier includes a bias circuit, a voltage amplifier circuit, and a potential hold portion, for example. The bias circuit generates a bias potential having a constant potential in accordance with the bias current. The voltage amplifier circuit amplifies the difference between the potential of the input feedback signal FB and the input reference potential $V_{REF}$ in accordance with the bias potential, and outputs the amplified signal. The potential hold portion includes a capacitor and a switch. The switch is intermittently turned on or off using the timer 138, so that the bias potential can be held in accordance with the mode switching signal output from the timer 138. Thus, even when the function of the bias circuit is stopped, the bias potential can be continuously supplied to the reference clock generation circuit.

The operational trans-conductance amplifier includes a bias circuit, a voltage amplifier circuit, and a potential hold portion, for example. The bias circuit generates a bias potential having a constant potential in accordance with the bias current. The voltage amplifier circuit amplifies the difference between the potential of the input feedback signal FB and the input reference potential $V_{REF}$ in accordance with the bias potential, and outputs the amplified signal. The potential hold portion includes a capacitor and a switch. The switch is intermittently turned on or off using the timer 138, so that the bias potential can be held in accordance with the mode switching signal output from the timer 138. Thus, even when the function of the bias circuit is stopped, the bias potential can be continuously supplied to the reference clock generation circuit.

Note that the input potential Vin is supplied to the operational amplifiers and/or the operational trans-conductance amplifier of the error amplifier 132, and the supply of the input potential Vin to the bias circuits in the operational amplifiers and/or the operational trans-conductance amplifier can be stopped in accordance with the mode switching signal output from the timer 138, so that the generation of the bias potential can be stopped. Note that a switch for power gating may be provided in the bias circuit between the bias circuit and the wiring for applying the input potential Vin and is turned on or off to stop the supply of the input voltage potential Vin to the bias circuit.

The potential hold portion in the error amplifier 132 can hold the reference potential $V_{REF}$ supplied from the reference voltage generation circuit 130. Thus, the error amplifier 132 can be operated if supply of power to the reference voltage generation circuit 130 is stopped.

The comparator 133 is supplied with an error signal and a triangle wave and generates a pulse width modulation signal. The comparator 133 includes a bias circuit, a comparison circuit, and a potential hold portion, for example. The bias circuit generates a bias potential having a constant potential in accordance with the bias current. The comparison circuit compares the potential of the error signal and the potential of the triangle wave in accordance with the bias potential, and generates a signal using the magnitude relation obtained by the comparison in accordance with the bias potential. The potential hold portion includes a capacitor and a switch. The on or off of the switch is intermittently controlled using the timer 138, so that the bias potential can be held in accordance with the mode switching signal output from the timer 138. Thus, even when the function of the bias circuit is stopped, the bias potential can be continuously supplied to the comparison circuit.

Note that the input potential Vin is supplied to the comparator 133, and the supply of the input potential Vin to the bias circuit in the comparator 133 can be stopped in accordance with the mode switching signal output from the timer 138, so that the generation of the bias potential can be stopped. Note that a switch for power gating may be provided between the bias circuit and the wiring for applying the input potential Vin and is turned on or off to stop the supply of the input potential Vin to the bias circuit.

The timer 138 is a circuit having a function of outputting a mode switching signal for switching a state every specified period of time to the band gap reference circuit 136, the reference voltage generation circuit 130, the reference bias generation circuit 137, the triangle wave generation circuit 131, the error amplifier 132, and the comparator 133. The mode switching signal is a signal for switching between a first mode and a second mode. The mode switching signal is generated such that, for example, the wave number of the clock signal generated in the triangle wave generation circuit 131 every specified period of time is counted using a counter or the like to switch mode.

In the first mode, the level of the mode switching signal is a high level. In the first mode, the switches of the potential hold portions included in the triangle wave generation circuit 131, the error amplifier 132, and the comparator 133 are turned on so that the bias potential is applied to the potential hold portions. In the first mode, the switches for power gating may be turned on to supply the input potential Vin to the bias circuits included in the triangle wave generation circuit 131, the error amplifier 132, and the comparator 133. In the first mode, the switches for power gating may be turned on to supply the input potential Vin to the band gap reference circuit 136, the reference voltage generation circuit 130, and the reference bias generation circuit 137. The first mode is also referred to as a sampling mode.

Figure 13A:
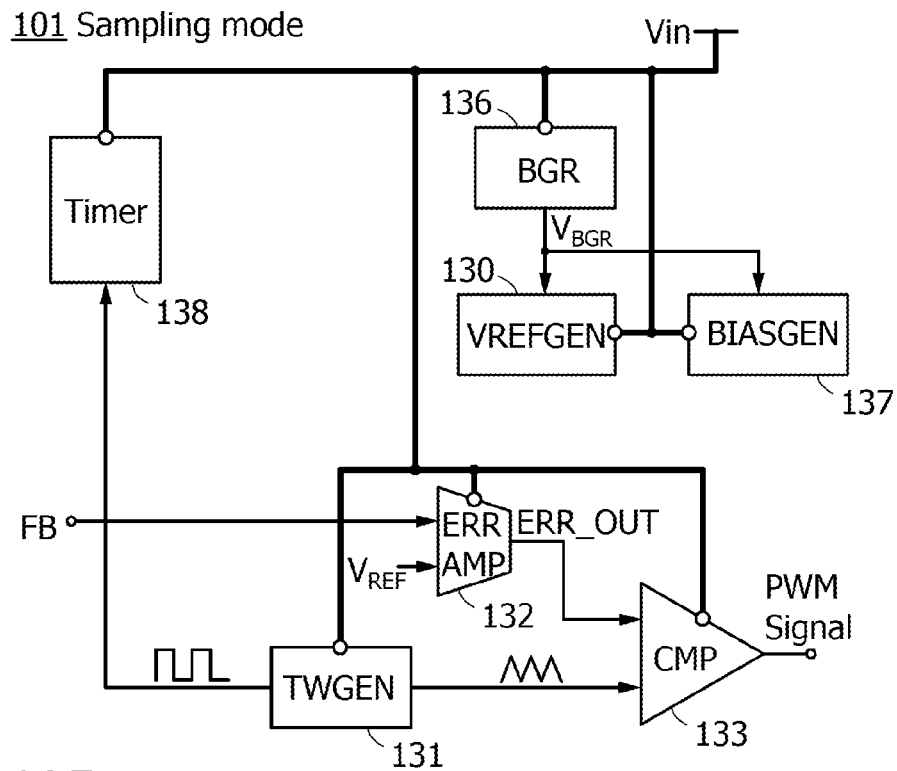
FIGS. 13A and 13B are diagrams illustrating operation examples of a controller circuit.

FIG. 13A is a block diagram visualizing the state of supply of the input potential Vin in the first mode in the controller circuit 101 illustrated in FIG. 12. A thick solid arrow in FIG. 13A indicates the supply of the input potential Vin.

In the second mode, the level of the mode switching signal is a low level. In the second mode, the switches of the potential hold portions included in the triangle wave generation circuit 131, the error amplifier 132, and the comparator 133 are turned on so that the bias potential is applied to the potential hold portions. In the second mode, the switches for power gating may be turned off to supply the input potential Vin to the bias circuits included in the triangle wave generation circuit 131, the error amplifier 132, and the comparator 133. In the second mode, the switches for power gating may be turned on to supply the input potential Vin to the band gap reference circuit 136, the reference voltage generation circuit 130, and the reference bias generation circuit 137. The second mode is also referred to as a hold mode.

Figure 13B:
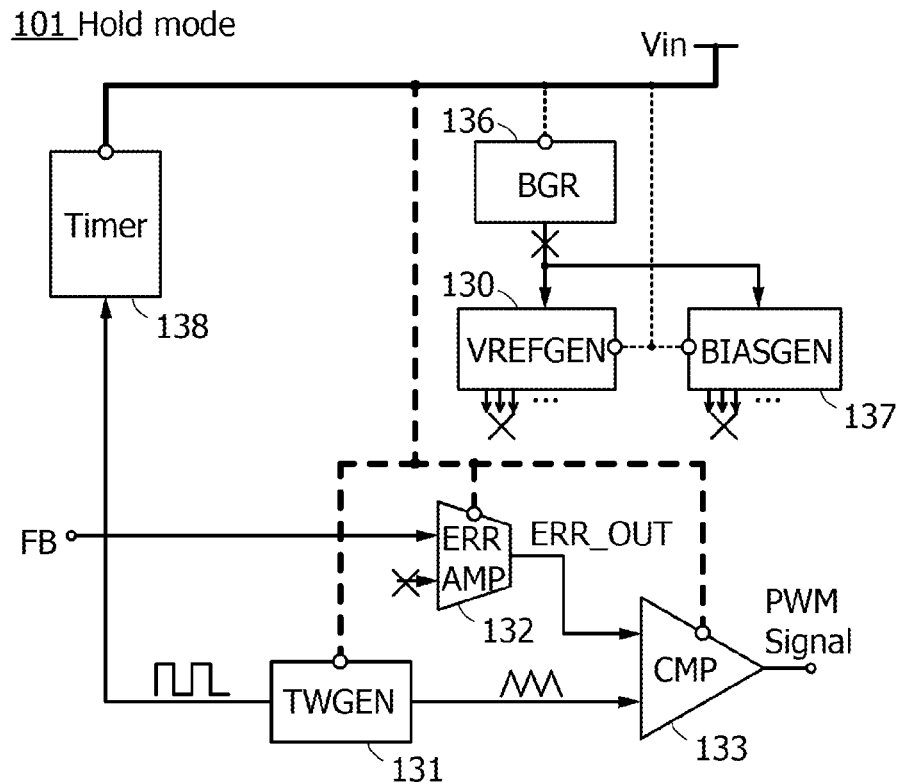

FIG. 13B is a block diagram visualizing the state of supply of the input potential Vin in the second mode in the controller circuit 101 illustrated in FIG. 12. A thick solid arrow in the drawing indicates that the input potential Vin is supplied to a circuit. A thick dotted arrow in FIG. 13B indicates that the input potential Vin is partially supplied to a circuit (e.g., supply to a circuit other than the bias circuit). A thin dotted arrow in the drawing indicates that supply of the input potential Vin to a circuit is stopped. A cross mark in FIG. 13B indicates that the supply of a signal from a circuit is stopped.

With the use of the above-described structure, switching between sampling and holding of a potential can be intermittently controlled in the potential hold portions included in the triangle wave generation circuit 131, the error amplifier 132, and the comparator 133, in accordance with the mode switching signal output from the timer 138. The mode switching can be achieved by controlling the switches included in the potential hold portions. Note that each of the potential hold portions can hold the bias potential having a constant potential that is generated in the bias circuit, whereby a circuit in the next stage can continuously output a signal even in a period in which the supply of power to the bias circuit is stopped. Thus, the use of the controller circuit having the structure of this embodiment achieves a reduction in power consumption. Furthermore, the use of the controller circuit having the structure of this embodiment enables a DCDC converter to operate without a reduction in performance even when the supply of power to some of the circuits of the controller circuit is stopped.

To describe the structures of the potential hold portions included in the triangle wave generation circuit 131, the error amplifier 132, and the comparator 133, specific examples of circuit configurations of the circuits are described below.

Figure 14:
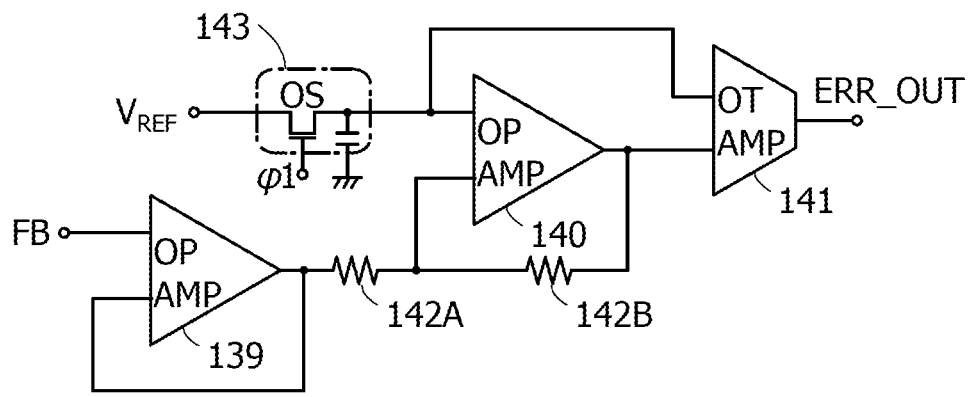
FIG. 14 is an example of a block diagram of an error amplifier circuit.

FIG. 14 illustrates an example of a circuit configuration of the error amplifier 132. The error amplifier 132 illustrated in FIG. 14 includes an operational amplifier 139, an operational amplifier 140, an operational trans-conductance amplifier 141, a resistor 142A, a resistor 142B, and a potential hold portion 143.

A feedback signal and an output signal of the OP amplifier 139 are applied to an input terminal of the OP amplifier 139. The reference potential $V_{REF}$ via the potential hold portion 143, an output signal of the OP amplifier 139 via the resistor 142A, and an output signal of the OP amplifier 140 are applied to an input terminal of the OP amplifier 140. The output signal is fed back negatively, via the resistor 142B, to the input terminal to which the output signal of the OP amplifier 139 is applied. The reference potential $V_{REF}$ via the potential hold portion 143 and an output signal of the OP amplifier 140 are applied to an input terminal of the OT amplifier 141. An error signal is output from an output terminal of the OT amplifier 141.

The potential hold portion 143 includes a transistor serving as a switch and a capacitor. A gate of the transistor serving as a switch is supplied with the mode switching signal to control on or off of the transistor.

A transistor with extremely low off-state current is used as the transistor serving as a switch; for example, an OS transistor in which a channel is formed in an oxide semiconductor film can be used.

Note that low off-state current means that a normalized leakage current per micrometer in channel width at room temperature is lower than or equal to 10 zA/μm. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, approximately 0.1 to 10 V.

In this specification, the OS transistor is a transistor in which an oxide semiconductor is used in a semiconductor layer to be a channel formation region, and the word "OS" is added to indicate this.

The OS transistor has extremely low off-state current and can hold electric charge stored in a capacitor for sufficiently long time. Thus, even when the OS transistor is turned off, the potential of one input of an OP amplifier is the same or substantially the same as the reference potential $V_{REF}$ which is input to the input when the OS transistor is on. That is, the error amplifier 132 can be normally operated without supply of the reference potential $V_{REF}$ from the reference voltage generation circuit 130. This eliminates the need for continuous output of the reference potential $V_{REF}$ from the reference voltage generation circuit 130, and consequently, the reference voltage generation circuit 130 is not required to be operated at all times. Thus, the supply of power to the reference voltage generation circuit 130 can be stopped without stopping the operation of the error amplifier 132 and power consumption of the reference voltage generation circuit 130 can be reduced.

The transistor serving as a switch is switched in accordance with the mode switching signal; the transistor is on in the first mode, and is off in the second mode. When the transistor in which a channel is formed in an oxide semiconductor film is used as a switch, even in the case where a potential of a node to which the switch and the capacitor are connected is kept constant and then the switch is turned off, the amount of electric charges leaking through the switch can be extremely small.

The OS transistor used for the potential hold portion 143 may formed using an oxide semiconductor layer stacked over a silicon transistor and may include a backgate, as the switching transistor 102 in Embodiment 1.

Figure 15A:
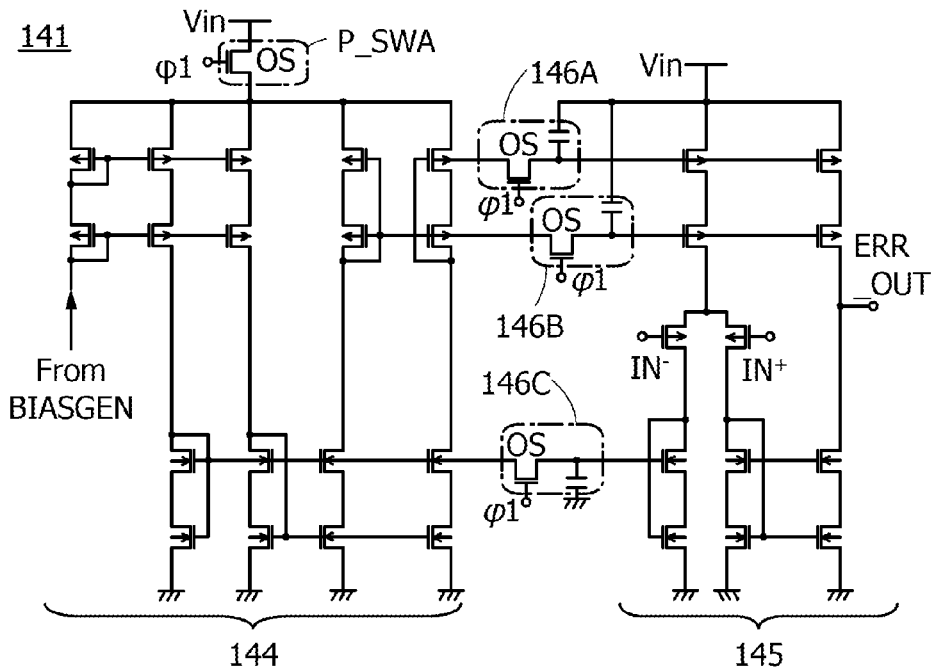
FIGS. 15A and 15B are examples of a circuit diagram of an OT amplifier circuit and a circuit diagram of an OP amplifier circuit, respectively.

FIG. 15A illustrates a specific example of a circuit configuration of the operational trans-conductance amplifier 141. The operational trans-conductance amplifier 141 includes a bias circuit 144, a voltage amplifier circuit 145, potential hold portions 146A to 146C, and a power switch P_SWA.

The bias circuit 144 has a function of generating bias potentials, which are constant potentials and used in the voltage amplifier circuit 145, in accordance with the bias current supplied from the reference bias generation circuit 137. Note that the bias potentials are obtained by feeding current to transistors to which the input potential Vin is applied. The plurality of potentials is thus obtained and applied as bias potentials to gates of transistors included in the voltage amplifier circuit 145 via the potential hold portions 146A to 146C. Note that the bias circuit 144 may be formed using a current source control circuit or the like using a current mirror.

The voltage amplifier circuit 145 has a function of outputting an error signal obtained by amplifying a feedback signal. A signal is input to an input terminal IN$^+$ and an input terminal IN$^-$ with the bias potentials applied to the gates of the transistors via the potential hold portions 146A to 146C, so that the error signal is output from the voltage amplifier circuit 145. Note that the voltage amplifier circuit 145 may be formed using a differential amplifier circuit and a current source control circuit or the like using a current mirror.

The potential hold portions 146A to 146C each include a transistor serving as a switch and a capacitor, like the potential hold portion 143.

Figure 16A:
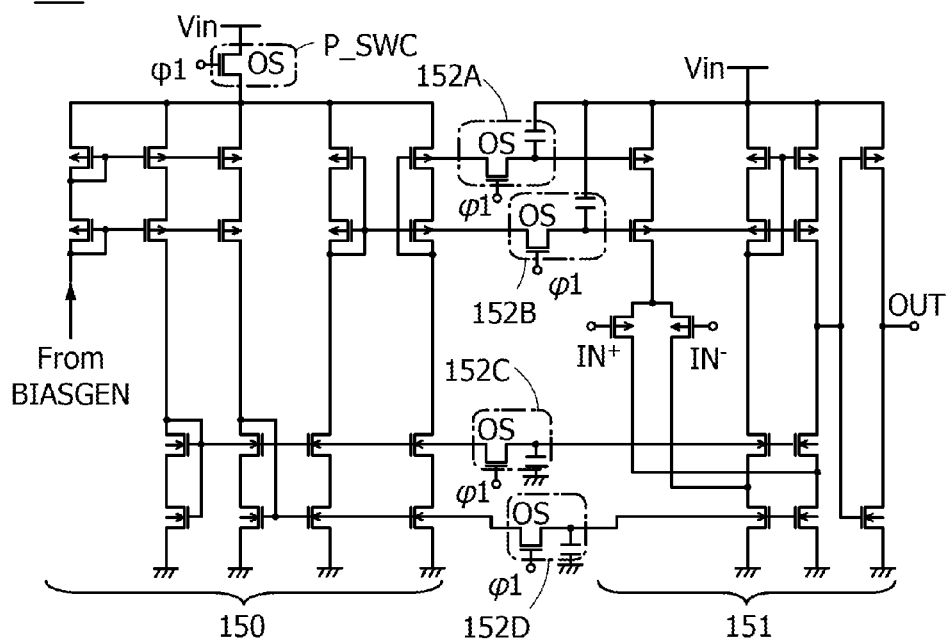
FIGS. 16A and 16B are examples of a circuit diagram of a comparator and a circuit diagram of a triangle wave generation circuit, respectively.

The power switch P_SWA is composed of a transistor serving as a power switch. The conduction of the transistor serving as a power switch can be controlled by the mode switching signal supplied to a gate of the transistor. Note that FIG. 16A is an example in which an OS transistor is used as the power switch P_SWA, and other semiconductors (e.g., silicon) may be used. Furthermore, P-channel TFT may be used without limitation to an N-channel TFT. The signal for controlling the power switch P_SWA may be a signal other than the mode switching signal.

In each of the potential hold portions 146A to 146C, the switch is turned off to hold a constant potential generated in the bias circuit 144 at the node to which the switch and the capacitor are connected. Such a structure eliminates the need for continuously outputting the constant potential from the bias circuit 144, and thus, the power switch P_SWA can be turned off and the operation of the bias circuit 144 can be stopped. The supply of potential to the bias circuit can be stopped without stopping the operation of the operational trans-conductance amplifier 141; the operational trans-conductance amplifier 141 in which power consumption of the bias circuits 144 can be reduced is achieved.

Note that the capacitor included in each of the potential hold portions 146A to 146C is connected to a ground line or a wiring to which the input potential Vin is supplied. One electrode of the capacitor is connected to a wiring having a constant potential. The capacitor is not necessarily provided when a parasitic capacitance or a gate capacitance of the transistor is used.

The transistors included in the bias circuit 144 and the voltage amplifier circuit 145 are preferably transistors in each of which silicon is used for a semiconductor layer to be a channel formation region. With such a structure, the amount of current flowing in the transistors can be increased, achieving high-speed circuit operation.

Figure 15B:
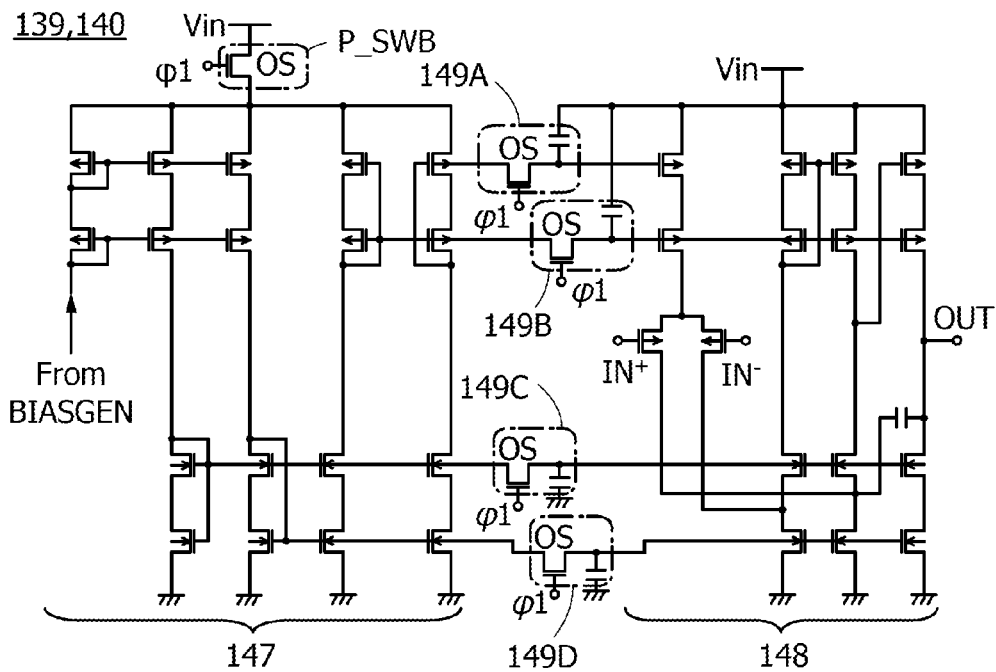

FIG. 15B illustrates a specific example of a circuit configuration of each of the operational amplifiers 139 and 140. The operational amplifier 139 (or the operational amplifier 140) includes a bias circuit 147, a voltage amplifier circuit 148, potential hold portions 149A to 149D, and a power switch P_SWB.

The bias circuit 147 is a circuit having a function of generating bias potentials, which are constant potentials and used in the voltage amplifier circuit 148, in accordance with the bias current supplied from the reference bias generation circuit 137. Note that the bias potentials are obtained by feeding current to transistors to which the input potential Vin is applied. The plurality of potentials is thus obtained and applied as bias potentials to gates of transistors included in the voltage amplifier circuit 148 via the potential hold portions 149A to 149D. Note that the bias circuit 147 may be formed using a current-mirror circuit.

The voltage amplifier circuit 148 is a circuit having a function of outputting an output signal OUT by inputting a signal to an input terminal IN$^+$ and an input terminal IN$^-$ with the bias potentials applied to the gates of the transistors via the potential hold portions 149A to 149D. Note that the voltage amplifier circuit 148 may be formed using a differential amplifier circuit and a current source control circuit or the like using a current mirror.

The potential hold portions 149A to 149D each include a transistor serving as a switch and a capacitor, like the potential hold portion 143. The power switch P_SWB includes a transistor serving as a switch, like the power switch P_SWA.

In each of the potential hold portions 149A to 149D, by turning off the switch, a constant potential generated in the bias circuit 147 can be held at the node to which the switch and the capacitor are connected. Such a structure eliminates the need for continuously outputting the constant potential generated in the bias circuit 147, and thus, the power switch P_SWB can be turned off to stop the operation of the bias circuit 147. Therefore, the supply of power to the bias circuit can be stopped without stopping the operation of the operational amplifiers 139 and 140; the operational amplifiers 139 and 140 in which power consumption of the bias circuits 147 can be reduced are achieved.

The transistors included in the bias circuit 147 and the voltage amplifier circuit 148 preferably use silicon for a semiconductor layer which is to be a channel formation region. With such a structure, the amount of current flowing in the transistors can be increased, achieving high-speed circuit operation.

FIG. 16A illustrates a specific example of a circuit configuration of the comparator 133. The comparator 133 includes a bias circuit 150, a comparison circuit 151, potential hold portions 152A to 152D, and a power switch P_SWC.

The bias circuit 150 has a function of generating bias potentials, which are constant potentials and used in the comparison circuit 151, in accordance with the bias current supplied from the reference bias generation circuit 137. Note that the bias potentials are obtained by feeding current to transistors to which the input potential Vin is applied. The plurality of potentials is thus obtained and applied as bias voltages to gates of transistors included in the comparison circuit 151 via the potential hold portions 152A to 152D. Note that the bias circuit 150 may be formed using a current-mirror circuit.

The comparison circuit 151 is a circuit having a function of outputting an output signal OUT by inputting a signal to an input terminal IN$^+$ and an input terminal IN$^-$ with a bias potential applied to gates of transistors via the potential hold portions 152A to 152D. Note that the comparison circuit 151 may be formed of a differential amplifier circuit and a current-mirror circuit.

The potential hold portions 152A to 152D each include a transistor serving as a switch and a capacitor, like the potential hold portion 143. The power switch P_SWC includes a transistor serving as a switch, like the power switch P_SWA.

In each of the potential hold portions 152A to 152D, the switch is turned off to hold a constant potential generated in the bias circuit 150 at the node to which the switch and the capacitor are connected. Such a structure eliminates the need for continuously outputting the constant potential generated in the bias circuit 150, and thus, the power switch P_SWC is turned off and the operation of the bias circuit 150 can be stopped. The supply of power to the bias circuit 150 can be stopped without stopping the operation of the comparator 133; consequently, the comparator 133 can operate without a reduction in performance, and power consumption of the bias circuit 150 in the comparator 133 can be reduced.

The transistors included in the bias circuit 150 and the comparison circuit 151 preferably use silicon for a semiconductor layer which is to be a channel formation region. With such a structure, the amount of current flowing in the transistors can be increased, achieving high-speed circuit operation.

Figure 16B:
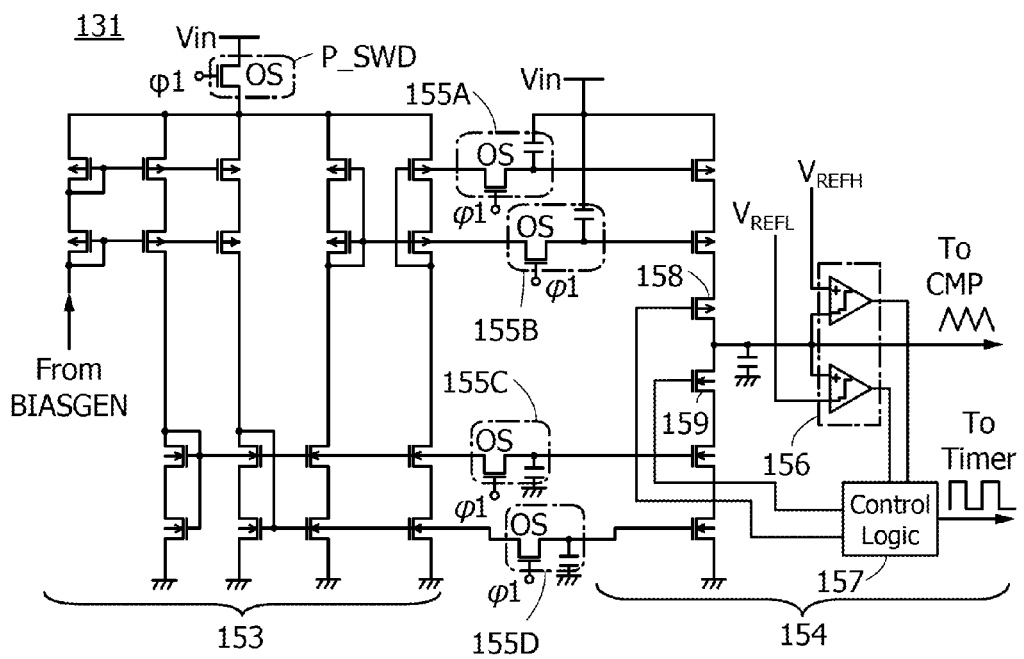

FIG. 16B is an example of a specific circuit configuration of the triangle wave generation circuit 131. The triangle wave generation circuit 131 includes a bias circuit 153, a clock generation portion 154, potential hold portions 155A to 155D, and a power switch P_SWD.

The bias circuit 153 has a function of generating bias potentials, which are constant potentials and used in the clock generation portion 154, in accordance with the bias current supplied from the reference bias generation circuit 137. Note that the bias potentials are obtained by feeding current to transistors to which the input potential Vin is applied. The plurality of voltages is thus obtained and applied as bias potentials to gates of transistors included in the clock generation portion 154 via the potential hold portions 155A to 155D. Note that the bias circuit 153 may be formed using a current source control circuit or the like using a current mirror.

The clock generation portion 154 includes a comparison circuit 156, a control logic circuit 157 (abbreviated to "Control Logic" in the drawing), and transistors 158 and 159 serving as switches. In the clock generation portion 154, the transistors 158 and 159 are alternately switched by the control logic circuit 157 with bias potentials applied to gates of transistors via the potential hold portions 155A to 155D so that an increase and a decrease in voltage is performed at a constant speed. In the clock generation portion 154, the voltage that increases and decreases at a constant speed is compared with a reference potential $V_{REFH}$, and the potential that increases and decreases at a constant speed is compared with a reference potential $V_{REFL}$. The comparisons are performed using the comparison circuit 156. The control logic circuit 157 controls on or off of the transistors 158 and 159 using the comparison results obtained by the comparison circuit 156, and the potential that increases and decreases at a constant speed is shaped into the form of a triangle wave. The control logic circuit 157 can generate a clock signal in synchronization with the triangle wave.

The potential hold portions 155A to 155D each include a transistor serving as a switch and a capacitor, like the potential hold portion 143. The power switch P_SWD includes a transistor serving as a switch, like the power switch P_SWA.

In each of the potential hold portions 155A to 155D, the switch is turned off and a constant potential generated in the bias circuit 153 can be held at the node to which the switch and the capacitor are connected. Such a structure eliminates the need for continuously outputting the constant potential generated in the bias circuit 153, and thus, the power switch P_SWD can be turned off and the operation of the bias circuit 153 can be stopped. The supply of potential to the bias circuit can be stopped without stopping the operation of the clock generation portion 154; power consumption of the bias circuit 153 can be reduced in the triangle wave generation circuit 131.

The transistors included in the bias circuit 153 and the clock generation portion 154 preferably use silicon for a semiconductor layer which is to be a channel formation region. With such a structure, the amount of current flowing in the transistors can be increased, achieving high-speed circuit operation.

Figure 17A:
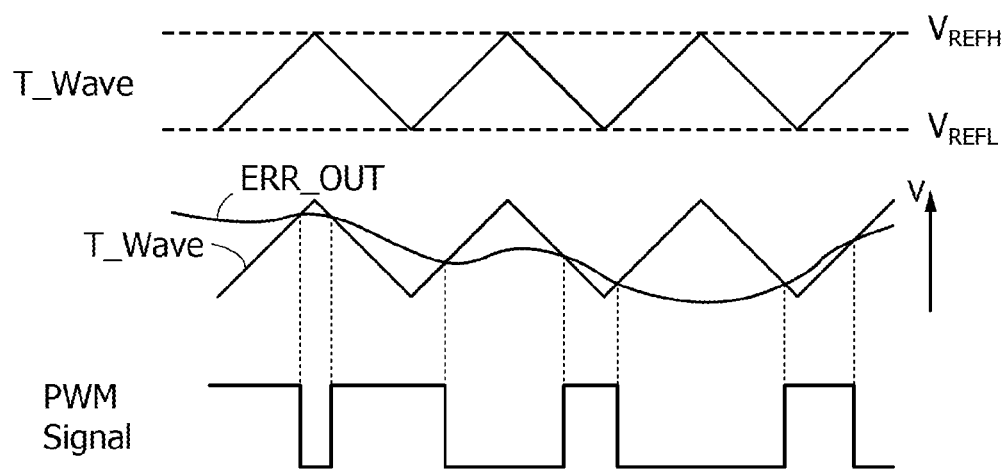
FIGS. 17A and 17B show operation examples of a semiconductor device.

The operation of the comparator 133 is described with reference to FIG. 17A. FIG. 17A shows a waveform of a triangle wave (T_Wave), waveforms of a triangle wave input to the comparator 133 and an output signal (ERR_OUT) of the error amplifier 132 which are overlapped, and a waveform of a pulse width control signal output from the comparator 133.

As in FIG. 17A, the triangle wave output from the triangle wave generation circuit 131 represents a signal that periodically rises to the reference potential $V_{REFH}$ and falls to the reference potential $V_{REFL}$ (see FIG. 16B). The waveform of the signal output from the error amplifier 132 and input to the comparator 133 changes continuously in accordance with a feedback signal that changes in a manner similar to that of the output potential Vout.

In the comparator 133, a square wave (a pulse width control signal, PWM signal) can be generated using the magnitude relation between the two signals. The PWM signal is used for controlling switching of the transistors in the DCDC converter as in Embodiment 1 so that the output potential Vout has a constant potential, for example.

Figure 17B:
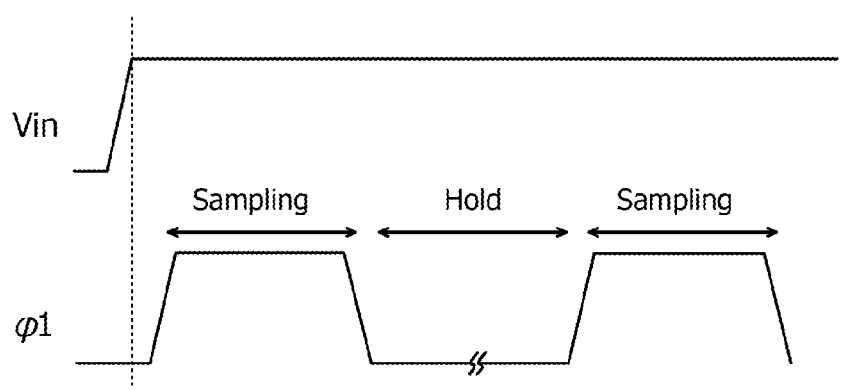

Next, control of the switch using the timer 138 is described with reference to FIG. 17B. FIG. 17B shows change in input potential Vin and a signal waveform of the mode switching signal $\phi 1$.

In the controller circuit 101 in this embodiment, switching between the first mode and the second mode is conducted with the use of the mode switching signal $\phi 1$ as described above. By the switching between the first mode and the second mode, a constant potential generated in the bias circuit provided in each of the clock generation circuit, the error amplifier 132, and the comparison circuit can be intermittently held in the potential hold portion.

Specifically, as shown in FIG. 17B, with rising of the input potential Vin, the mode switching signal $\phi 1$ is changed to select the first mode (sampling mode). Then, the mode switching signal $\phi 1$ is changed to select the second mode (hold mode). After a lapse of a specified period of time measured by the timer 138, the mode switching signal $\phi 1$ is switched so that the first mode is selected again. In this manner, switching between the first mode and the second mode is repeated.

The first mode and the second mode are alternately switched using the timer 138 included; thus, power consumption of the circuits included in the controller circuit 101 can be reduced. Specifically, the supply of potential to the bias circuit 144, the bias circuit 147, the bias circuit 150, and the bias circuit 153 in the triangle wave generation circuit 131, the error amplifier 132, and the comparator 133 is configured to be stopped in the second mode. With such a structure, current is prevented from flowing in the bias circuits in the second mode, and power consumption can be reduced accordingly.

Note that in the structure of this embodiment, the performance of the triangle wave generation circuit 131, the error amplifier 132, and the comparator 133 is not reduced even when the supply of potential to the bias circuit 144, the bias circuit 147, the bias circuit 150, and the bias circuit 153 which are included in the circuits is stopped intermittently.

Specifically, in the second mode, the constant potentials obtained in the bias circuit 144, the bias circuit 147, the bias circuit 150, and the bias circuit 153 can be held at the nodes to each of which the switch and the capacitor are connected, in the potential hold portions 146A to 146C, the potential hold portions 149A to 149D, the potential hold portions 152A to 152D, and the potential hold portions 155A to 155D.

The stop of potential supply to the bias circuits does not affect signals output from the voltage amplifier circuits 145 and 148, the comparison circuit 151, and the clock generation portion 154, which operate using the constant potentials.

The error amplifier 132 can hold the reference potential $V_{REF}$ and consequently a signal output from the error amplifier does not change if the reference voltage generation circuit 130 which outputs the reference potential is not operated. Thus, the controller circuit 101 in the second mode can be operated without a reduction in performance.

Furthermore, the following structure is effective: in the second mode, control is performed so that the supply of potential to the band gap reference circuit 136, the reference voltage generation circuit 130, and the reference bias generation circuit 137 is stopped. With such a structure, current is intermittently prevented from flowing in the circuits in the second mode, and power consumption can be reduced.

One embodiment of the present invention described above can provide a DCDC converter which is capable of achieving low power consumption and operating without a reduction in performance even when the supply of power to some of the circuits included in the controller circuit 101 is stopped.

This implementation can be implemented in appropriate combination with any of the other implementations and the like.

Embodiment 3

In Embodiment 3, an oxide semiconductor that can be used for the semiconductor layer in the OS transistor described in the above embodiment will be described.

An oxide semiconductor used for the semiconductor layer including a channel formation region of the transistor preferably contains at least indium (In) or zinc (Zn). In particular, In and Zn are preferably contained. stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer including a channel formation region of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

If an oxide semiconductor film forming the semiconductor layer including a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is thus preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Oxygen also in the oxide semiconductor film can be reduced by the dehydration treatment (dehydrogenation treatment); thus, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

An oxide semiconductor which is formed may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be sometimes shown in the CAAC-OS. In most cases, crystal parts in the CAAC-OS each fit inside a cube whose one side is less than 100 nm in a TEM image. In addition, boundary between the crystal parts and a grain boundary in the CAAC-OS are not clearly observed sometimes. In the CAAC-OS, since a clear grain boundary does not exist, for example, segregation of an impurity, high density of defect states, and a reduction in electron mobility are unlikely to occur.

The CAAC-OS may include a plurality of crystal parts in which c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at 2θ of around 31 degrees which shows alignment appears sometimes. Furthermore, spots (luminescent spots) are sometimes observed in an electron diffraction pattern of the CAAC-OS. An electron diffraction pattern obtained with an electron beam having a beam diameter of 10 nmφ or smaller, or 5 nmφ or smaller, is called a nanobeam electron diffraction pattern. In the CAAC-OS, among crystal parts, the directions of the a-axis and the b-axis of one crystal part are different from those of another crystal part, in some cases. In the CAAC-OS, c-axes are aligned, and a-axes and/or b-axes are not macroscopically aligned sometimes.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. The term "parallel" includes a range from −10° to 10°, preferably from −5° to 5°.

The CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus can have a low carrier density. Thus, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region sometimes has a small variation in electrical characteristics and high reliability. Charges trapped by the trap states in the oxide semiconductor take a long time to be released and may behave like fixed charges. Thus, the transistor including the oxide semiconductor having a high density of trap states in the channel formation region may have unstable electrical characteristics.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may contain polycrystal, for example. Note that an oxide semiconductor containing polycrystal is referred to as a polycrystalline oxide semiconductor. A polycrystalline oxide semiconductor contains a plurality of crystal grains.

An oxide semiconductor may contain microcrystal, for example. Note that an oxide semiconductor containing microcrystal is referred to as a microcrystalline oxide semiconductor.

In an image obtained with a TEM or the like, crystal parts cannot be shown clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM or the like, a boundary between crystal parts is not clearly detected in some cases. A clear grain boundary does not exist in the image; thus, segregation of an impurity, high density of defect states, and a reduction in electron mobility are unlikely to occur in the nc-OS.

In the nc-OS, a microscopic region (for example, a region with a size greater than or equal to 1 nm and less than or equal to 10 nm) has a periodic atomic order occasionally. Furthermore, in the nc-OS, crystal parts are not regularly-arranged. Thus, there is a case where periodic atomic order is not observed macroscopically or a case where long-range order in atomic arrangement is not observed, and the nc-OS cannot be distinguished from an amorphous oxide semiconductor, depending on an analysis method. When the nc-OS is analyzed by an out-of-plane method with an XRD apparatus using an X-ray having a beam diameter larger than the diameter of a crystal part, a peak which shows alignment does not appear sometimes. A halo pattern is sometimes shown in an electron diffraction pattern of the nc-OS obtained by using an electron beam having a beam diameter larger than the diameter of a crystal part (for example, a beam diameter of 20 nmϕ or more, or 50 nmϕ or more). Spots are sometimes shown in a nanobeam electron diffraction pattern of the nc-OS obtained by using an electron beam having a beam diameter smaller than or equal to the diameter of a crystal part (for example, a beam diameter of 10 nmϕ or less, or 5 nmϕ or less). In a nanobeam electron diffraction pattern of the nc-OS, regions with high luminance in a circular pattern are sometimes shown, and a plurality of spots may appear in the region.

The microscopic region in the nc-OS has a periodic atomic order occasionally; consequently the nc-OS has lower density of defect states than the amorphous oxide semiconductor. Note that crystal parts in the nc-OS are not regularly-arranged; thus, the nc-OS has higher density of defect states than the CAAC-OS.

The oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This implementation can be implemented in appropriate combination with any of the other implementations and the like.

Embodiment 4

In Embodiment 4, examples of electronic devices each including the DCDC converter described in the above embodiment are described. Examples of the electronic devices include computers, portable information terminals (including mobile phones, portable game machines, audio reproducing devices, and the like), electronic paper, television devices (also referred to as televisions or television receivers), and digital video cameras.

Figure 18A:
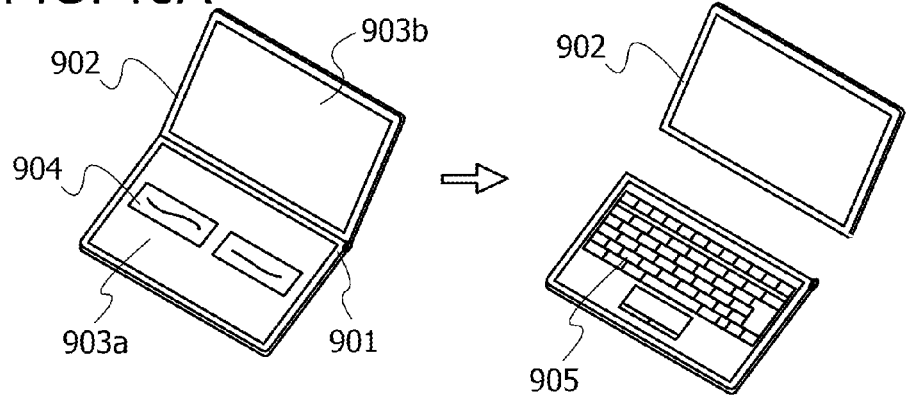
FIGS. 18A to 18E show examples of electronic devices each including a DCDC converter.

FIG. 18A illustrates a portable information terminal that includes a housing 901, a housing 902, a first display portion 903a, a second display portion 903b, and the like. The DCDC converter described in any of the above embodiments is provided inside at least part of the housings 901 and 902. Thus, the portable information terminal can achieve low power consumption and operate without a reduction in performance even when the supply of power to some of the circuits included in the DCDC converter is stopped.

Note that the first display portion 903a is a touch panel, and for example, as illustrated in the left of FIG. 18A, which of "touch input" and "keyboard input" is performed can be selected by a selection button 904 displayed on the first display portion 903a. Since the selection buttons with a variety of sizes can be displayed, the portable information terminal can be easily used by people of any generation. For example, when "touch input" is selected, a keyboard 905 is displayed on the first display portion 903a as illustrated in the right of FIG. 18A. With such a structure, letters can be input quickly by keyboard input as in the case of using a conventional information terminal, for example.

One of the first display portion 903a and the second display portion 903b can be detached from the portable information terminal as illustrated in the right of FIG. 18A. The second display portion 903b can also function as a touch panel for a reduction in weight to carry around to be operated by one hand while the other hand supports the housing 902, which is convenient.

The mobile phone in FIG. 18A can have a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 18A may transmit and receive data wirelessly. Through wireless communication, desired book data or the like can be purchased and downloaded from an e-book server.

Moreover, the housing 902 illustrated in FIG. 18A may be equipped with an antenna, a microphone function, or a wireless communication function to be used as a mobile phone.

Figure 18B:
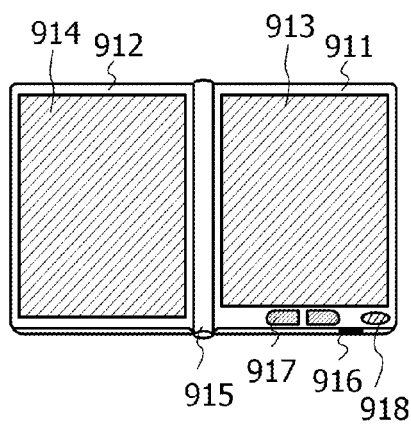

FIG. 18B illustrates an electronic book reader in which electronic paper is incorporated. The electronic book reader has two housings of a housing 911 and a housing 912. The housing 911 and a housing 912 are provided with a display portion 913 and a display portion 914 respectively. The housing 911 is connected to the housing 912 by a hinge 915, so that the e-book reader can be opened and closed using the hinge 915 as an axis. The housing 911 is provided with a power switch 916, an operation key 917, a speaker 918, and the like. At least one of the housing 911 and the housing 912 is provided with the DCDC converter described in any of the above embodiments. Thus, the electronic book can achieve low power consumption and operate without a reduction in performance even when the supply of power to some of the circuits included in the DCDC converter is stopped.

Figure 18C:
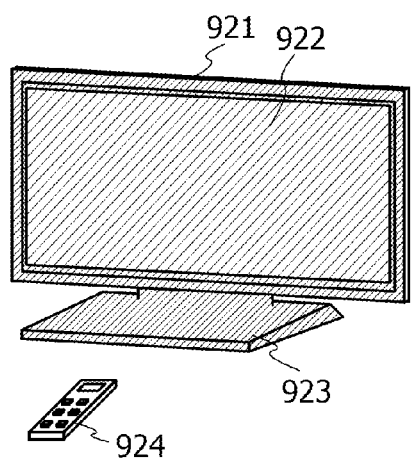

FIG. 18C illustrates a television device including a housing 921, a display portion 922, a stand 923, and the like. The television device can be operated with a switch of the housing 921 and a remote controller 924. The DCDC converter described in any of the above embodiments is provided in the housing 921 and the remote controller 924. Thus, the television device can achieve low power consumption and operate without a reduction in performance even when the supply of power to some of the circuits included in the DCDC converter is stopped.

Figure 18D:
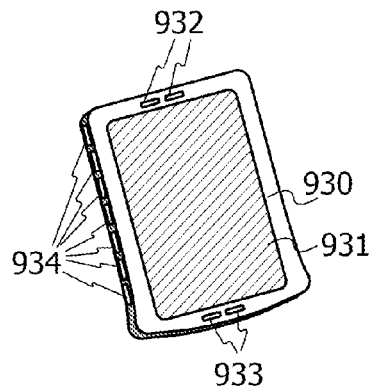

FIG. 18D illustrates a smartphone in which a main body 930 is provided with a display portion 931, a speaker 932, a microphone 933, operation keys 934, and the like. The DCDC converter described in any of the above embodiments is provided in the main body 930. Thus, the smartphone can achieve low power consumption and operate without a reduction in performance even when the supply of power to some of the circuits included in the DCDC converter is stopped.

Figure 18E:
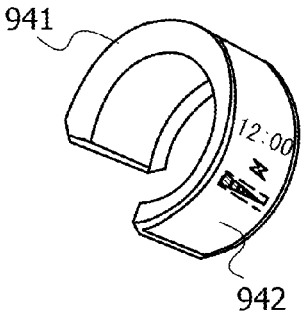

FIG. 18E is a wrist watch type display device including a main body 941, a display portion 942, and the like. The DCDC converter described in any of the above embodiments is provided in the main body 941. Thus, the wrist watch type display device can achieve low power consumption and operate without a reduction in performance even when the supply of power to some of the circuits included in the DCDC converter is stopped.

As described above, the DCDC converter described in any of the above embodiments is provided for each of the electronic devices described in this embodiment. Thus, the electronic devices can achieve low power consumption and operate without a reduction in performance even when the supply of power to some of the circuits included in the DCDC converter is stopped.

This application is based on Japanese Patent Application serial no. 2013-158403 filed with Japan Patent Office on Jul. 31, 2013, the entire contents of which are hereby incorporated by reference.

What is claimed is:

1. A semiconductor device comprising:
  a substrate comprising a semiconductor material;
  a controller circuit comprising a first transistor, the first transistor comprising a channel formation region in the substrate; and
  a second transistor, a channel formation region of the second transistor comprising an oxide semiconductor layer,
  wherein the controller circuit is configured to supply a signal to a first gate of the second transistor,
  wherein the second transistor is stacked over the first transistor with an insulating film provided therebetween,
  wherein the second transistor comprises a second gate overlapping with the first gate, and
  wherein the second gate is electrically connected to the substrate via at least one wiring and one contact plug.

2. The semiconductor device according to claim 1, wherein the signal is a pulse width modulation signal, and
  wherein the second transistor is a switching transistor.

3. The semiconductor device according to claim 1, wherein the semiconductor material of the substrate comprises single crystal silicon.

4. The semiconductor device according to claim 1, wherein each of a source electrode and a drain electrode of the second transistor have a comb-like shape.

5. The semiconductor device according to claim 1, wherein the wiring comprises copper.

6. The semiconductor device according to claim 1, wherein the contact plug comprises copper.

7. The semiconductor device according to claim 1,
  wherein the controller circuit comprises:
    a clock generation circuit configured to output a triangle wave;
    an error amplifier configured to output an error signal;
    a comparator configured to output a control signal in accordance with the triangle wave and the error signal; and
    a timer configured to output a switching signal,
  wherein each of the clock generation circuit, the error amplifier, and the comparator comprises:
    a bias circuit configured to output a bias potential; and
    a switch and a capacitor,
  wherein the capacitor is configured to hold the bias potential intermittently in accordance with the switching signal supplied to the switch.

8. The semiconductor device according to claim 7,
  wherein supply of power to the bias circuit is stopped when the capacitor holds the bias potential.

9. The semiconductor device according to claim 1,
  wherein the controller circuit comprises:
    a timer configured to output a switching signal,
    a band gap reference circuit configured to output a first reference voltage;

a reference voltage generation circuit configured to output a second reference voltage in accordance with the first reference voltage; and a reference bias generation circuit configured to output a bias current in accordance with the first reference voltage, wherein supply of an input voltage to each of the band gap reference circuit, the reference bias generation circuit, and the reference voltage generation circuit is stopped in accordance with the switching signal.

10. A semiconductor device comprising:

a substrate comprising a semiconductor material;

a controller circuit comprising a first transistor, the first transistor comprising a channel formation region in the substrate; and a second transistor, a channel formation region of the second transistor comprising an oxide semiconductor layer, wherein the controller circuit is configured to supply a signal to a first gate of the second transistor, wherein the second transistor is stacked over the first transistor with an insulating film and a barrier layer provided therebetween, wherein the second transistor comprises a second gate overlapping with the first gate, and wherein the second gate is in contact with the barrier layer.

11. The semiconductor device according to claim 10, wherein the signal is a pulse width modulation signal, and wherein the second transistor is a switching transistor.

12. The semiconductor device according to claim 10, wherein the semiconductor material of the substrate comprises single crystal silicon.

13. The semiconductor device according to claim 10, wherein each of a source electrode and a drain electrode of the second transistor have a comb-like shape.

14. The semiconductor device according to claim 10, wherein the barrier layer comprises any one of silicon nitride, aluminum oxide, aluminum nitride, and aluminum oxynitride.

15. The semiconductor device according to claim 10, wherein the controller circuit comprises:

a clock generation circuit configured to output a triangle wave;

an error amplifier configured to output an error signal;

a comparator configured to output a control signal in accordance with the triangle wave and the error signal; and a timer configured to output a switching signal, wherein each of the clock generation circuit, the error amplifier, and the comparator comprises:

a bias circuit configured to output a bias potential; and a switch and a capacitor, wherein the capacitor is configured to hold the bias potential intermittently in accordance with the switching signal supplied to the switch.

16. The semiconductor device according to claim 15, wherein supply of power to the bias circuit is stopped when the capacitor holds the bias potential.

17. The semiconductor device according to claim 10, wherein the controller circuit comprises:

a timer configured to output a switching signal, a band gap reference circuit configured to output a first reference voltage;

a reference voltage generation circuit configured to output a second reference voltage in accordance with the first reference voltage; and a reference bias generation circuit configured to output a bias current in accordance with the first reference voltage, wherein supply of an input voltage to each of the band gap reference circuit, the reference bias generation circuit, and the reference voltage generation circuit is stopped in accordance with the switching signal.

* * * * *